United States Patent
Parker

(10) Patent No.: US 7,227,142 B2
(45) Date of Patent: Jun. 5, 2007

(54) DUAL DETECTOR OPTICS FOR SIMULTANEOUS COLLECTION OF SECONDARY AND BACKSCATTERED ELECTRONS

(75) Inventor: N. William Parker, Pleasanton, CA (US)

(73) Assignee: Multibeam Systems, Inc., Santa Clara, CA (US)

( * ) Notice: Subject to any disclaimer, the term of this patent is extended or adjusted under 35 U.S.C. 154(b) by 0 days.

(21) Appl. No.: 11/093,000

(22) Filed: Mar. 28, 2005

(65) Prior Publication Data

US 2006/0054817 A1 Mar. 16, 2006

Related U.S. Application Data

(60) Provisional application No. 60/608,609, filed on Sep. 10, 2004.

(51) Int. Cl.
*H01J 37/244* (2006.01)
(52) U.S. Cl. .................. 250/310; 250/397; 250/491.1; 250/492.2
(58) Field of Classification Search ................ 250/397, 250/310
See application file for complete search history.

(56) References Cited

U.S. PATENT DOCUMENTS

| | | | |
|---|---|---|---|
| 4,742,234 A | 5/1988 | Feldman et al. | |
| 4,788,431 A * | 11/1988 | Eckes et al. | 250/397 |
| 4,902,898 A | 2/1990 | Jones et al. | |
| 5,430,292 A | 7/1995 | Honjo et al. | |
| 5,466,940 A * | 11/1995 | Litman et al. | 250/397 |
| 5,608,218 A | 3/1997 | Sato et al. | |
| 5,644,132 A | 7/1997 | Litman et al. | |
| 5,900,667 A * | 5/1999 | Veneklasen et al. | 257/429 |
| 5,981,947 A * | 11/1999 | Nakasuji et al. | 250/310 |
| 5,982,190 A | 11/1999 | Toro-Lira | |
| 6,075,245 A | 6/2000 | Toro-Lira | |
| 6,734,428 B2 | 5/2004 | Parker et al. | |
| 6,777,675 B2 * | 8/2004 | Parker et al. | 250/310 |
| 6,878,936 B2 | 4/2005 | Kienzle et al. | |
| 6,943,351 B2 | 9/2005 | Parker et al. | |
| 2005/0001165 A1 | 1/2005 | Parker et al. | |

OTHER PUBLICATIONS

Reimer, L., Scanning Electron Microscopy, 2nd ed., Springer-Verlag, pp. pp. 147, 149 and 153, (1998).

* cited by examiner

*Primary Examiner*—Nikita Wells
*Assistant Examiner*—Johnnie L Smith, II
(74) *Attorney, Agent, or Firm*—David H. Jaffer; Pillsbury Winthrop Shaw Pittman LLP

(57) ABSTRACT

A detector optics system for an electron probe system is disclosed. Aspects of the detector optics system include: the ability to simultaneously detect two electron populations, secondary electrons (SEs) and backscattered electrons (BSEs), wherein both populations are emitted from a substrate due to the impact of the electron probe. The design of the detector optics utilizes a field-free tunnel and substrate electric-field control electrodes to enable separation of the SEs and BSEs into two detectors, allowing simultaneous acquisition of topographic and elemental composition data, with minimal impact on the electron probe. The secondary electron signal is a monotonically-varying function of the voltage on the substrate surface. The ratio of the SE signal to the BSE signal gives a testing signal which is independent of the primary beam current and serves as an absolute voltage probe of surface voltages without the need for an external reference voltage.

22 Claims, 24 Drawing Sheets

DUAL DETECTOR OPTICS FOR SIMULTANEOUS COLLECTION OF SECONDARY AND BACKSCATTERED ELECTRONS

CROSS-REFERENCE TO RELATED APPLICATIONS

This application claims the benefit of U.S. provisional application Ser. No. 60/608,609 filed Sep. 10, 2004.

BACKGROUND OF THE INVENTION

1. Field of the Invention

This invention relates generally to the field of electron optics, and more particularly to electron detector optics for large substrate electron-beam testing systems.

2. Description of the Related Art

Electron beam systems employed for testing or inspection purposes typically generate a primary electron beam (or "probe") which is focused onto the surface of a substrate by probe-forming optics. The signal detection process generally involves the collection of secondary electrons (SEs) and/or backscattered electrons (BSEs) which are emitted from the substrate surface as a result of the interaction of the primary electron beam with the substrate surface. In LCD substrate testing systems, the energy of the primary electron beam striking the substrate surface is generally in the range from 2 keV to 20 keV. SEs leaving the substrate surface have energies predominantly below 10 eV, while BSEs leaving the substrate surface predominantly have energies near that of the primary beam. The rate of generation of both SEs and BSEs from the substrate surface is proportional to the current in the primary electron beam, therefore variations in the primary beam current will lead to corresponding fluctuations in the detected SE and BSE signals. These fluctuations are undesirable since they cannot be distinguished from fluctuations arising from surface topography, elemental composition variations or changes in the surface voltage. Thus there is a need to generate a test signal which is not affected by fluctuations in the primary beam current.

Another requirement for electron beam testing of substrates, such as those used in the manufacture of LCD displays, is to be able to use the primary electron beam as a probe of the voltage on the surface of the substrate. This is possible if one of the signals is a monotonically-varying function of the surface voltage. The reason why it is necessary for the signal to be monotonic is to maintain a 1:1 mapping between the detected signal and the surface voltage—if the curve is not monotonic (i.e., the curve has the same signal level for N different surface voltage levels, where N>1), then there will be an N:1 mapping between possible values of the surface voltage and the detected signal and it will not be possible to determine the surface voltage unambiguously, as is familiar to those skilled in the art. A related requirement is for the signal to be a nearly-linear function of the voltage on the surface of the substrate—this requirement arises from the need to achieve the same signal-to-noise ratio, independent of the surface charging voltage. If the signal varies only a small amount for a large change in the surface voltage, then the signal-to-noise ratio will be low, while a large change in signal for a small change in the surface voltage will give a high signal-to-noise ratio. Generally, it is desirable to maintain approximately the same signal-to-noise ratio throughout the surface charging voltage range to obtain the same precision in the measured values of the surface voltage. Thus, there is a need to configure the design of the detector optics to make the SE detection efficiency a monotonically-varying and nearly-linear function of the surface voltage.

In many prior art electron beam systems, the secondary electron and backscattered detectors are positioned within the probe-forming optics, and a velocity filter using crossed electric-and-magnetic fields (commonly called a Wien filter, or an E×B filter) is used to separate three populations of electrons:

1) Secondary electrons coming up the column from the substrate are deflected by the Wien filter far off-axis into a first detector.
2) Backscattered electrons coming up the column from the substrate are deflected by the Wien filter slightly off-axis into a second detector.
3) Primary beam electrons passing down the column pass through the Wien filter with minimal deflection.

There are several limitations to this approach:

1) Cost—a Wien filter requires complex machining of magnetic and electrode materials, as well as power supplies for the magnet coils.
2) Aberrations—the Wien filter always introduces some aberration (particularly chromatic) into the primary beam—this is a problem in low-voltage columns where the fractional energy spread (=$\Delta V/V_0$, where $\Delta V$=the energy spread and $V_0$=the column accelerating voltage) is larger.
3) Coupling between the SE and BSE signals—in many cases it is not possible to fully separate the SE and BSE signals, i.e., some of the SEs are collected by the BSE detector and some of the BSEs are collected by the SE detector.

In other electron beam systems, the secondary and backscattered electron detectors are positioned below the probe-forming optics, and off to one side of the optical axis of the probe-forming optics. In these systems, it is necessary that the electric fields from the detectors do not substantially affect the primary beam. This requirement typically limits the detector collection efficiencies. With low detector collection efficiencies, the signal-to-noise ratio will be low.

Thus, there is a need for improved detector optics which provides high secondary electron and backscattered collection efficiencies combined with low cost, no aberrations induced in the primary electron beam, and fully-separated secondary and backscattered electron signals.

SUMMARY OF THE INVENTION

A dual detector optics system for simultaneous collection of secondary and backscattered electrons is disclosed herein. This detector optics system is a part of an electron probe system as used for the testing of large substrates during manufacture. Such electron probe systems typically comprise: an electron source, electron optics to collect electrons from the source and focus them onto the substrate surface, deflectors to move the beam around on the substrate surface, a stigmator for correcting astigmatism in the beam, and a blanker for turning the beam on and off.

One aspect of the detector optics system of the present invention is an electrode configuration enabling complete separation (no "cross-talk") between the secondary electron (SE) and backscattered electron (BSE) signals, i.e., no SEs are collected by the BSE detector, and no BSEs are collected by the SE detector. This separation is important since the two signals provide complementary information about the substrate being tested:

1) The secondary electron signal is generated from near the surface of the substrate and provides topographical information about substrate surface structures.
2) The backscattered electron signal is due to interaction of beam electrons with nuclei within the substrate. Since the number of BSEs generated is strongly Z-dependent (Z=atomic number), the signal strength provides a method of differentiating between materials of high and low atomic number (elemental contrast).

Another aspect of the present invention is a detector optics electrode configuration which avoids almost all interaction between the primary electron beam and the electric fields due to the SE and BSE detectors. This is accomplished in a much simpler way than for the case of Wien filter detectors, thereby reducing cost and complexity.

A further aspect of the present invention is a detector optics electrode configuration which makes the secondary electron collection efficiency a monotonically-varying nearly-linear function of the voltage at the surface of the substrate being tested. This is important in testing applications where the primary beam is used as an absolute voltage probe for determining the functionality of electronic circuits on the substrate surface, as, for example, in the case of testing LCD substrates during manufacture. As illustrated in FIGS. 13–16, SEs and BSEs can strike the substrate a substantial distance away from the primary beam during testing. As a result, many pixels on the substrate surface may acquire some charge prior to illumination by the primary beam, thus it is important to be able to measure the absolute voltage of the substrate surface with the primary beam in order to account for these pre-charging effects. The "absolute voltage" is defined herein as the voltage with respect to the system ground potential, i.e., the potential on the ground electrode of the test system electronics. The design of the detector optics must minimize the pre-charging of the substrate in order to maintain the SE signal within the monotonic range illustrated in FIGS. 9–10.

A still further aspect of the present invention is detector optics enabling the SE and BSE signals to be combined in real-time using an electronic ratio circuit thereby allowing the calculation of a resulting (third) signal, S, having both desired characteristics simultaneously:
1) S is independent of the primary beam current.
2) S is a monotonically-varying nearly-linear function of the substrate surface voltage.

DETAILED DESCRIPTION OF THE PREFERRED EMBODIMENTS

The present invention disclosed herein is a detector optics system having dual detectors, one with high secondary electron (SE) detection efficiency combined with minimal resultant distortion of the electron beam, and the other for simultaneous detection of backscattered electrons (BSEs). The various detector optics electrodes are designed to make the secondary electron detection efficiency a nearly linearly-varying monotonic function of the substrate surface voltage, while the backscattered electron detection efficiency remains independent of the substrate surface voltage. Both the SE and BSE signals are proportional to the current in the primary electron beam which induces the emission of both the SEs and BSEs. The ratio of the SE and BSE signals, however, is independent of the current in the primary electron beam and is also a rapidly-varying monotonic function of the substrate surface voltage, enabling surface voltage measurements to be made at high bandwidth without fluctuations due to primary beam current variations. The present invention is particularly useful in applications utilizing large substrates, such as liquid-crystal displays (LCDs), field-emission displays (FEDs), and plasma displays.

Figure 1:
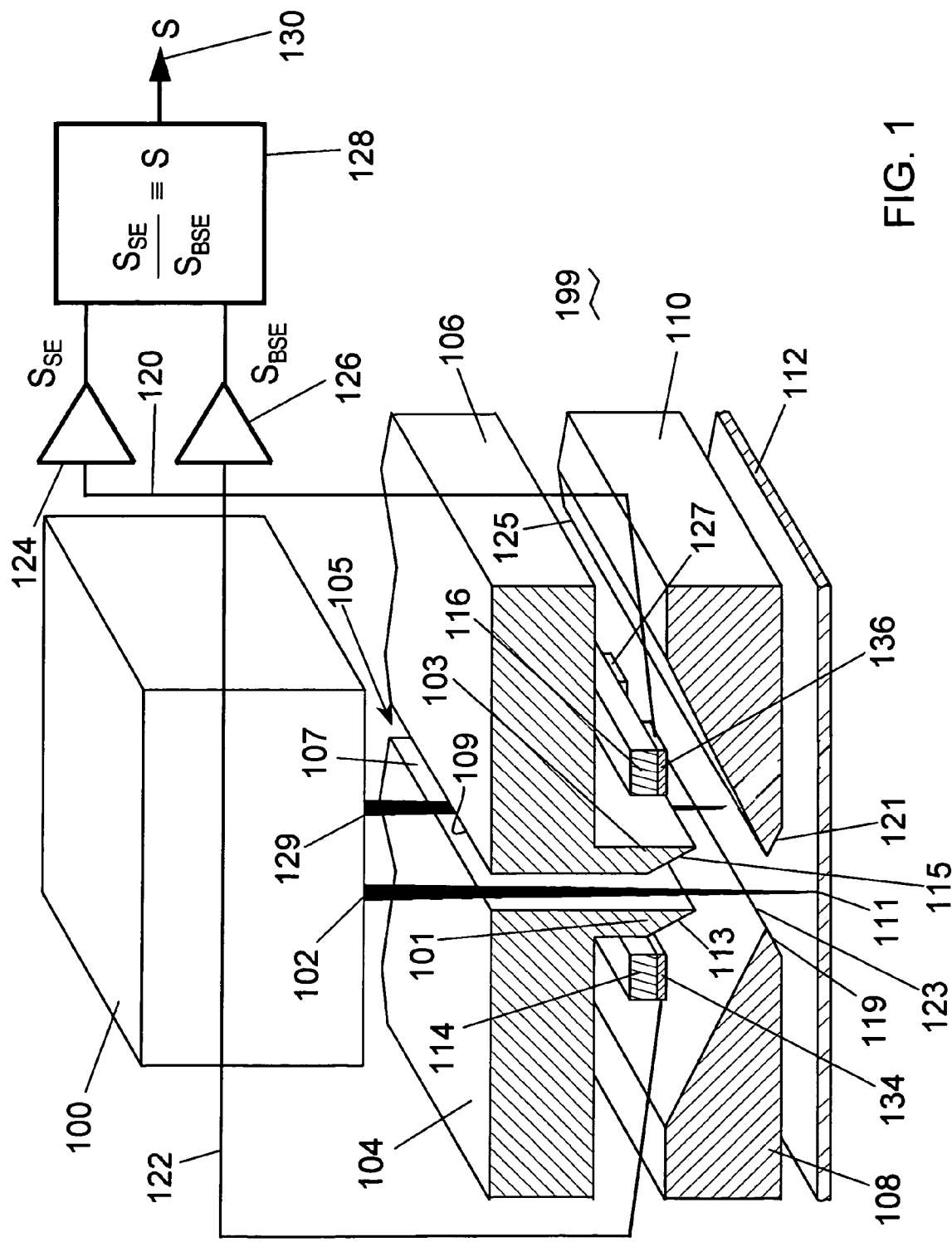
FIG. 1 is an isometric view of the dual detector optics showing a cross-sectional surface and a schematic of associated signal processing electronics.

Referring now to FIG. 1 of the drawing, an embodiment of the present invention is shown. A column assembly 100 provides one or more electron beams such as 102 to be applied onto a substrate 112 for use in detecting backscattered electrons and secondary electrons. Details of a column assembly are found in U.S. provisional patent application Ser. No. 60/608,609 filed Sep. 10, 2004 incorporated by reference herein. The electron beam applied to the substrate will also be referred to as an electron probe, because it is applied for the purpose of determining characteristics of the substrate. A detector optics assembly 199 is positioned between the column assembly 100 and the substrate 112. Considering the combination of the column assembly 100 and the detector optics assembly 199, the column assembly 100 is considered to be at the "top", and the detector optics assembly is at the "bottom" (independent of their orientations within the various figures), thus, for example, portion 101 is considered to be at the "lower" end of electrode 104. With this nomenclature, the beam 102 goes "down" from the column assembly 100 to the substrate 112. The detector optics assembly 199 includes a backscattered electron (BSE) detector 134 and a secondary electron (SE) detector 136 for detecting the BSEs and SEs caused by the impact of beam 102 on the substrate 112. The detector optics assembly 199 further includes a first field-free tunnel electrode 104 and a second field-free tunnel electrode 106. First electrode 104 has a first inside surface 107 forming one wall of a field-free tunnel (FFT) 105 for passage of an electron beam 102. Second electrode 106 has a second inside surface 109 facing the first inside surface 107, and with surface 107 forms the field-free tunnel 105 through which the electron beam 102 passes on a trajectory ending at the surface of a substrate 112 being probed and under test/examination. The tunnel 105 almost entirely shields the beam 102 from electric fields induced by the voltage differential between the SE detector 136 and the substrate 112. If the beam 102 were not shielded from these electric fields, aberrations could be induced which would enlarge the diameter of beam 102 at the substrate 112, adversely affecting the ability of beam 102 to test small features on substrate 112.

The backscattered electron detector 134 is placed on an opposite side of a lower portion 101 of the first field-free tunnel electrode 104 from the first inside surface 107. Similarly, secondary electron detector 136 is placed on an opposite side of a lower portion 103 of the second field-free tunnel electrode 106. The ends 113 and 115 of the field-free tunnel electrodes 104 and 106 are chamfered as shown in FIG. 1. When backscattered electrons and secondary electrons, for example emitted from a point 111 on the substrate, strike another surface, such as the chamfered areas 113 and 115, the surfaces may re-emit backscattered and secondary electrons. The angles and sizes of the chamfered areas 113 and 115 are optimized to minimize backscattered electrons from reaching a secondary electron detector 136, and to minimize secondary electrons from reaching the backscattered electron detector 134. The configuration shown in FIG. 1 has chamfer 113 facing away from the field-free tunnel 105, and chamfer 115 facing toward the field-free tunnel 105.

The detector optics assembly 199 also includes a first substrate electric field control electrode 108, positioned between a substrate 112 position and the backscattered electron detector 134 and the first field-free tunnel electrode 104. Electrode 108 is tapered to a first edge portion 123 facing inward towards a center plane of the detector optics assembly 199, wherein the center plane contains beam 102 and is parallel to edge portions 123 and 125 and perpendicular to substrate 112. A second substrate electric field control electrode 110 is positioned between the substrate 112 position and the secondary electron detector 136 and second field-free tunnel electrode 106. The electrode 110 is tapered to a second inside edge portion 125 facing the center plane and facing the first inside edge portion 123. The first and second inside edge portions 123 and 125 have first and second edge portion chamfer areas 119 and 121 optimized in size and angle so as to direct SEs and BSEs which are emitted from those areas back onto a substrate 112 under test so as to avoid the SEs and BSEs from reaching the detectors 134 and 136.

Detector optics assembly 199 can include one or more pairs of a backscattered electron detector and a secondary electron detector, each pair for detecting backscattered electrons and secondary electrons caused by impact of a particular electron beam with a substrate 112. For example, a secondary electron detector 127 is shown in FIG. 1 for detecting secondary electrons caused by electron beam 129. A backscattered electron detector is also included but not shown in FIG. 1 due to the nature of the perspective view. Any number of beams and detector pairs can be spaced along the tunnel 105. The present invention also includes variations in the assembly 199 of FIG. 1 that will be apparent to those skilled in the art. For example, the electrodes 104, 106, 108 and 110 need not be linearly arranged, but could be arranged to function with, for example, a curved or other configured channel. Also, it is to be noted that each detector pair in a multi-beam assembly would require electronics similar to that shown in FIG. 1 for the pair of detectors 134 and 136.

The following figures and corresponding text more fully describe the present invention and compare it with the prior art. FIGS. 2–5 show prior art arrangements, and FIGS. 6–24 describe the effect and optimization of the detector optics assembly 199 of the present invention.

The detector optics of the present invention is particularly well-suited for applications involving multiple-beams simultaneously testing pixels on a substrate surface, as described in FIGS. 2A and 2B in U.S. Provisional Patent Application #60/608,609, filed Sep. 10, 2004, incorporated by reference herein. As described above, there is a BSE detector and SE detector for each beam. Other elements of the detector optics, such as the field-free tunnel electrodes 104 and 106 and the substrate electric-field control electrodes 108 and 110 can be in common for all beams. FIG. 1 shows a SE detector support 116 and a BSE detector support 114, which may be in common for all beams, or unique to each beam.

FIG. 1 is an isometric view of the dual detector optics showing a cross-sectional surface and a schematic of associated signal processing electronics. The primary electron beam 102 is focused onto an area 111 on the surface of substrate 112 by an electron optics system 100 such as that disclosed in U.S. Provisional Patent Application #60/608,609 filed Sep. 10, 2004. Two substrate electric-field control electrodes 108 and 110 are spaced approximately 2 mm from the surface of substrate 112 and are typically biased about −15 V relative to substrate 112. The BSE detector 134 is mounted on the BSE detector support 114. The BSE detector 134 and BSE detector support 114 are typically biased about −15 V relative to the substrate surface 112. The SE detector 136 is mounted on the SE detector support 116. The SE detector 136 and SE detector support 116 are typically biased about +4000 V relative to the substrate surface 112. Field-free tunnel electrodes 104 and 106 form a field-free tunnel 105 which has two functions: (1) to shield the primary beam 102 from the electric field induced by the +4000 V bias voltage on the SE detector support 116 and the SE detector 136, and (2) to repel the SEs 602 and 702 shown in FIGS. 6 and 7, respectively, which emerge upwards from area 111 on the substrate surface 112. Field-free tunnel electrodes 104 and 106 are typically biased about −17 V relative to substrate 112. The reason for the chamfered edges on electrodes 104, 106, 108 and 110 will be made clear in subsequent figures. FIGS. 6, 7, and 12–24 correspond to views of SE and BSE trajectories projected into the cross-sectional surface shown in FIG. 1.

Signal connection 122 conducts the signal from the BSE detector 134 to amplifier 126, which generates the signal $S_{BSE}$. Signal connection 120 conducts the signal from the SE detector 136 to amplifier 124, which generates the signal $S_{SE}$. Signal connections 120 and 122 may be single wires, twisted pairs, coaxial cables, or optical fibers as is familiar to those skilled in the art. Both signals $S_{BSE}$ and $S_{SE}$ are proportional to the current in electron beam 102. Division circuit 128 calculates the ratio of the two signals: $S_{SE}/S_{BSE} \equiv S$, where the signal S is independent of the current in the primary electron beam 102. The design of the detector optics makes the signal $S_{SE}$ a rapidly-varying monotonic function of the voltage at area 111 on substrate surface 112 (see FIGS. 6 and 7), while the signal $S_{BSE}$ is independent of the voltage at area 111. The method for designing the detector optics involves extensive ray-tracing calculations as explained below. Thus, the signal S will also be a rapidly-varying monotonic function of the voltage at area 111 on substrate surface 112. Signal S can be used to generate an absolute voltage measurement of the voltage at area 111 on substrate surface 112, without the need for any external reference voltages, and without errors caused by fluctuations in the current in the primary electron beam 102.

Figure 2:
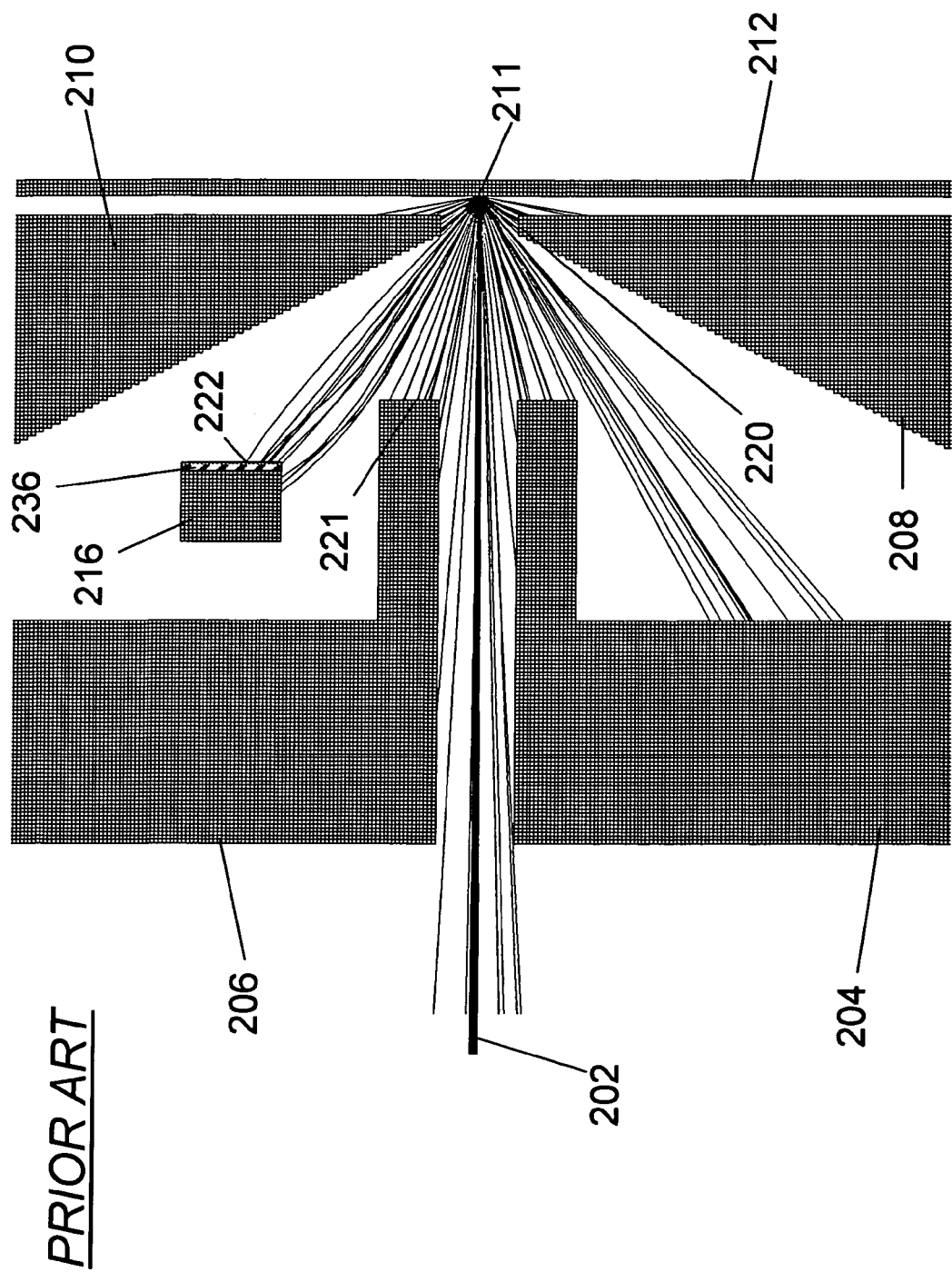
FIG. 2 is a cross-sectional representation of prior art dual detector optics showing the trajectories of 2000 eV backscattered electrons (BSEs) leaving the substrate surface.

FIG. 2 is a cross-sectional representation of prior art dual detector optics as described in U.S. Provisional Patent Application #60/608,609 showing the trajectories of 2000 eV BSEs leaving from area 211 on substrate surface 212. BSEs correspond to electrons from the primary beam 202, which have scattered off nuclei in the substrate 212 and subsequently exit back out of substrate 212. The BSEs typically have energies close to that of the primary beam 202 and generally have almost straight trajectories until they strike some electrode within the detector optics. Electrodes 204, 206, 208, and 210 in FIGS. 2–5 are analogous to, and have the same bias voltages as, electrodes 104, 106, 108, and 110 in FIG. 1, respectively. The BSEs strike the surfaces of the substrate electric-field control electrodes 208 and 210 nearest the substrate 212, the edges of substrate electric-field control electrodes 210 and 208 (at area 220), the ends of the electrodes 204 and 206 (at area 221), the SE detector 236 and the side of the SE detector support 216 nearest electrode 206. Since some BSEs from area 211 strike the SE detector 236, there is direct cross-talk between the BSE and SE signals. Direct cross-talk arises when some of the BSEs from area 211 strike the SE detector 236, thereby causing some of the "SE" signal to actually arise from BSEs, as is familiar to those skilled in the art.

Figure 3:
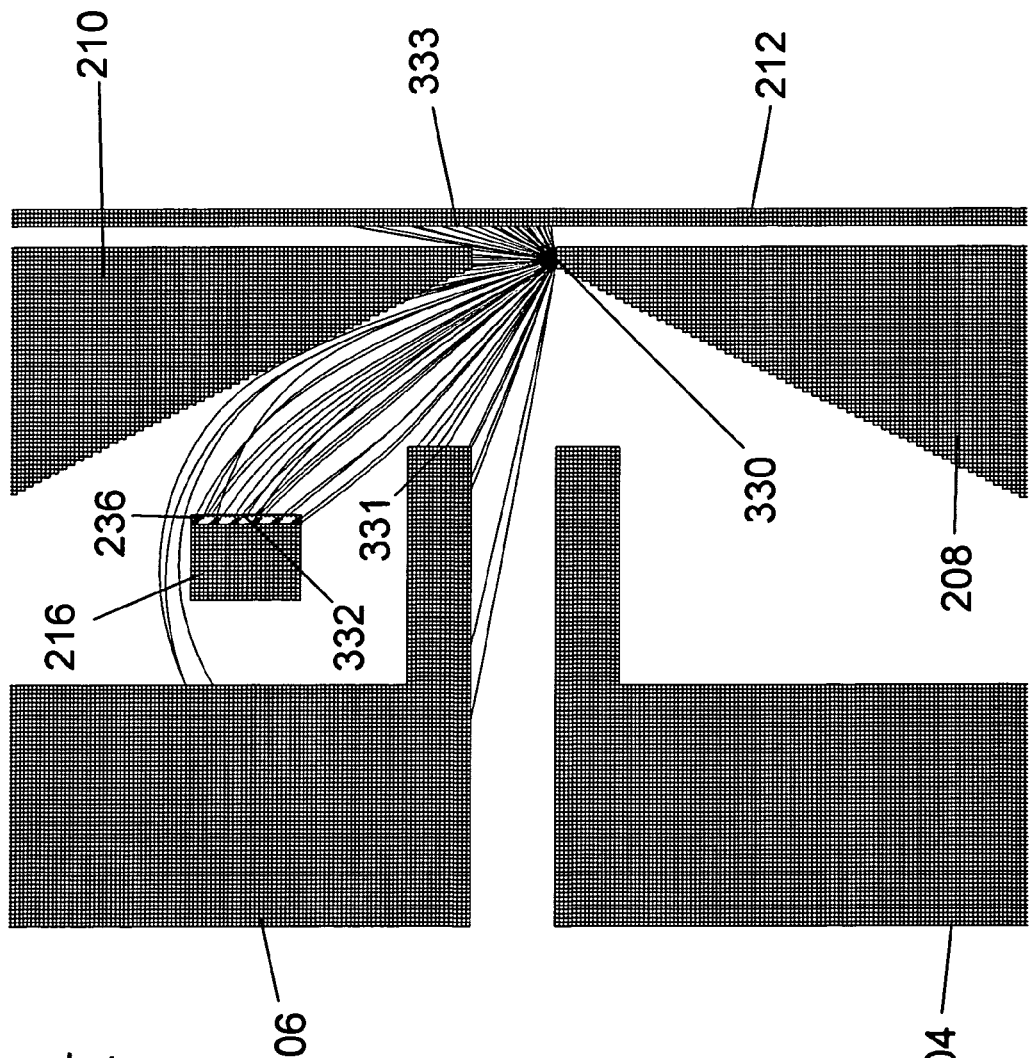
FIG. 3 is a cross-sectional representation of prior art dual detector optics showing the trajectories of 2000 eV BSEs leaving the edge of the substrate electric-field control electrode which is farther from the SE detector.

FIG. 3 is a cross-sectional representation of prior art dual detector optics as in FIG. 2 showing the trajectories of 2000 eV BSEs leaving from area 330 on the edge of substrate electric-field control electrode 208. The BSEs shown here are induced by the impact of BSEs striking area 220 in FIG. 2. A large number of BSEs leaving area 330 strike the substrate surface 212 at area 333. Most of the remaining BSEs leaving area 330 strike the SE detector 236 at area 332, thereby causing indirect cross-talk between the SE and BSE signals. Indirect cross-talk arises when BSEs induced by the primary beam strike a surface in the detector optics (such as area 220 in FIG. 2), and then emerge from area 330 to be collected by the SE detector 236, thereby causing some of the "SE" signal to actually arise from BSEs, as is familiar to those skilled in the art. A small fraction of BSEs strike the end of electrode 206 at area 331, which may cause the emission of SEs (see FIG. 5), also leading to indirect cross-talk between the SE and BSE signals.

Figure 4:
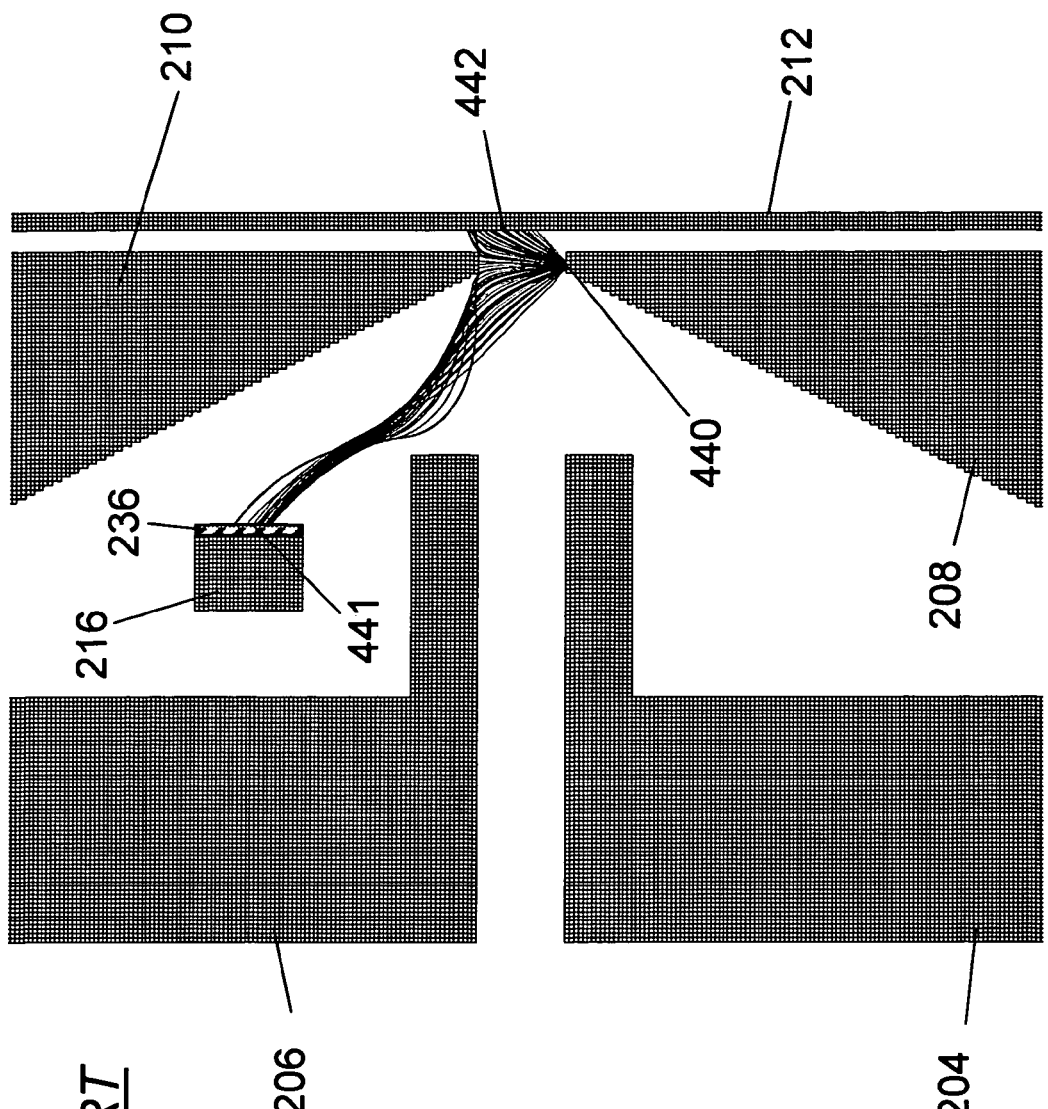
FIG. 4 is a cross-sectional representation of prior art dual detector optics showing the trajectories of 2 eV secondary electrons (SEs) leaving the edge of the substrate electric-field control electrode which is farther from the SE detector.

FIG. 4 is a cross-sectional representation of prior art dual detector optics as in FIG. 2 showing the trajectories of 2 eV SEs leaving from area 440 on the edge of substrate electric-field control electrode 208. The SEs shown here are induced by the impact of BSEs striking area 220 in FIG. 2. A substantial fraction of the SEs leaving area 440 in FIG. 4 strike the SE detector 236 at area 441, thereby causing indirect cross-talk between the SE and BSE signals. The remaining SEs strike the surface of substrate 212 at area 442.

Figure 5:
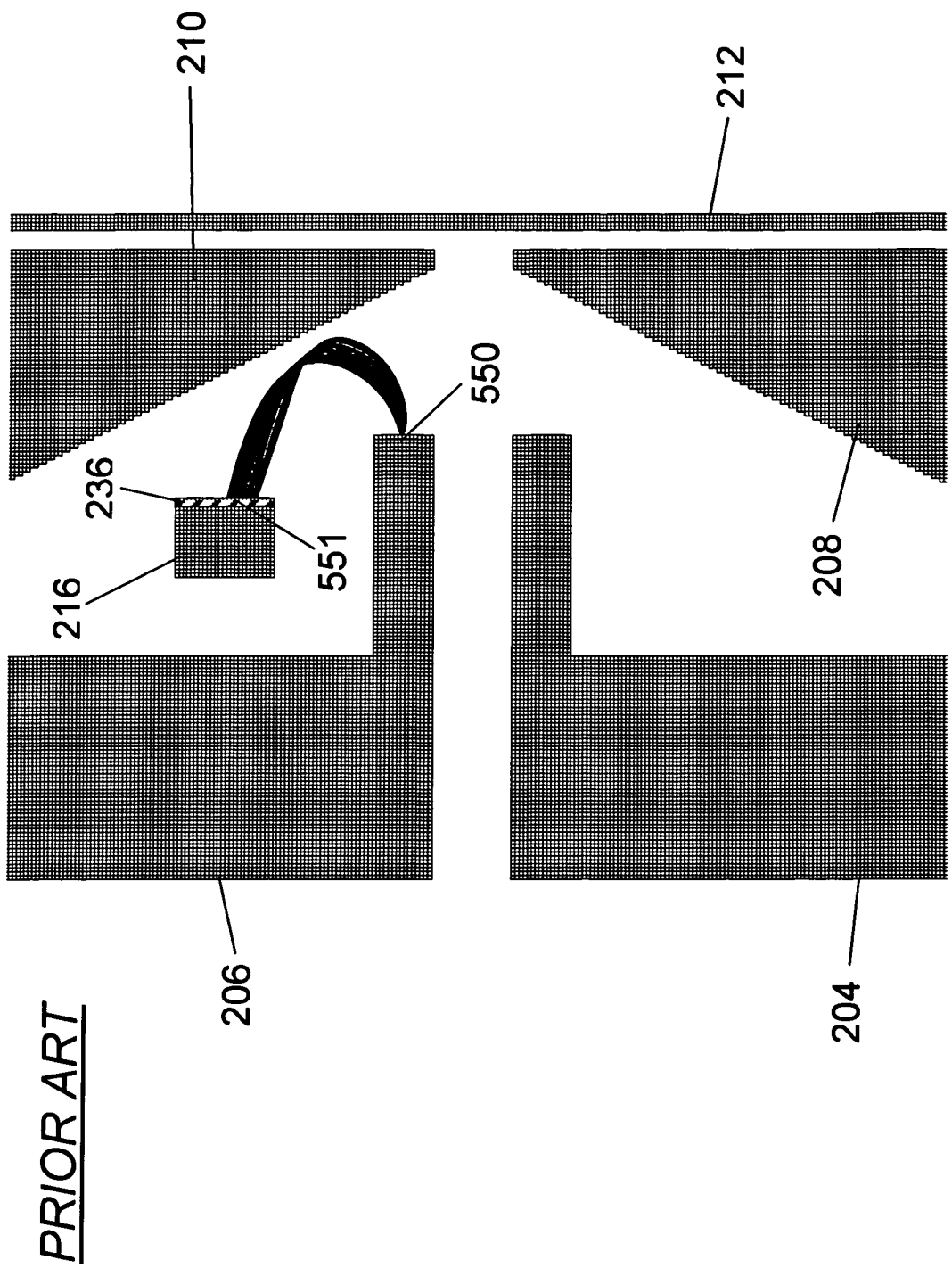
FIG. 5 is a cross-sectional representation of prior art dual detector optics showing the trajectories of 2 eV SEs leaving the end of the field-free tunnel which is nearer to the SE detector.

FIG. 5 is a cross-sectional representation of prior art dual detector optics as in FIG. 2 showing the trajectories of 2 eV secondary electrons leaving from area 550 at the end of electrode 206. The SEs shown here are induced by the impact of BSEs striking area 221 in FIG. 2. All of the SEs leaving area 550 in FIG. 5 strike the SE detector 236 at area 551, thereby causing indirect cross-talk between the SE and BSE signals.

FIGS. 2–5 show that the prior art detector optics demonstrates a substantial degree of both direct and indirect cross-talk between the SE and BSE signals, caused by the scattering of BSEs off various electrodes within the detector optics. Often in imaging or testing applications, it is desirable to obtain two simultaneous imaging or testing signals, one due solely to the SEs emitted by the substrate, and the other due solely to the BSEs emitted by the substrate. Therefore, it is an object of the present invention to provide two separate and simultaneous imaging or testing signals demonstrating no direct or indirect cross-talk between them to obtain both topographic and elemental composition information from a substrate simultaneously.

Design Method for the Improved Detector Optics

The design method for the improved detector optics of the present invention involves the use of extensive ray-tracing of electron trajectories within the detector optics. Ray tracing is a design technique familiar to those skilled in the art which involves the simulation of electron trajectories subject to electric and/or magnetic fields (in this case, only electric fields) which induce forces causing the electron trajectories to bend. Some SE and BSE trajectories begin at the substrate surface where they correspond to electron emission stimulated by the impact of the primary electron beam with the substrate surface. Other SE and BSE trajectories begin at other surfaces within the detector optics, where they correspond to SE and BSE emission stimulated by the impact of BSEs from the substrate. All ray tracing trajectories end when they reach some surface within the detector optics. If a trajectory ends at either the SE detector 136 or the BSE detector 134, then it corresponds to an electron which contributes to either the SE or BSE signals, respectively. The detector optics may be characterized by five performance factors:

1. SE Detection Efficiency—the fraction of SEs generated at the substrate which are collected by the SE detector 136—we want to maximize this.
2. BSE Detection Efficiency—the fraction of BSEs generated at the substrate which are collected by the BSE detector 134—we want to maximize this.
3. SE Detection Cross-Talk—the fraction of BSEs generated at the substrate which are collected by the SE detector 136—we want to minimize this.
4. BSE Detection Cross-Talk—the fraction of SEs generated at the substrate which are collected by the BSE detector 134—we want to minimize this.
5. Primary Beam Deflection—the displacement of the primary beam at the substrate surface (area 111) due to the electric fields generated by the various electrodes and detectors in the detector optics—we want to minimize this.

In order to simultaneously maximize 1 and 2, while minimizing 3–5, it is necessary to systematically modify the shapes, sizes and positions of the various electrodes (field-free tunnel electrodes 104 and 106, and substrate electric-field control electrodes 108 and 110) and the detectors (SE detector 136, SE detector support 116, BSE detector 134 and BSE detector support 114). With each design modification, a large number of ray-tracing calculations for both low-energy SEs and high-energy BSEs arising from the substrate 112 and from various other electrode surfaces (see FIGS. 6, 7, 12–24) is performed and trajectory-end statistics gathered. The trajectory-end statistics show the following:

1. How many SE trajectories end at the SE detector 136?
2. How many BSE trajectories end at the BSE detector 134?
3. How many BSE trajectories end at the SE detector 136?
4. How many SE trajectories end at the BSE detector 134?
5. How far is the primary beam deflected at the substrate surface 112 when the SE detector 136, the BSE detector 134, and electrodes 104, 106, 108 and 110 are set to various voltages?

Figure 12:
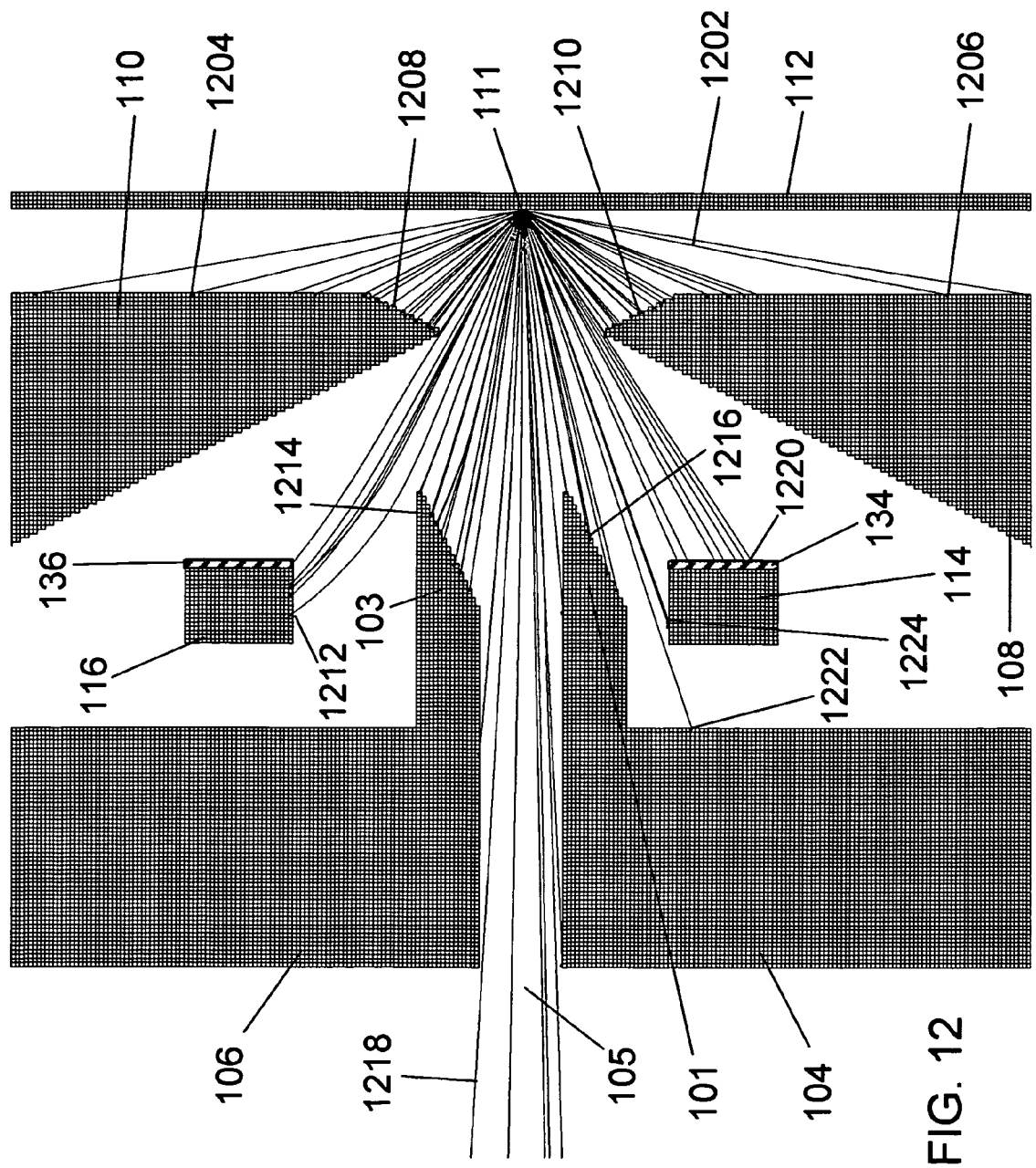
FIG. 12 is a cross-sectional representation of the dual detector optics of the present invention showing the trajectories of 2000 eV BSEs leaving the substrate surface.

The numerical answers to these five questions can then be compared with the similar answers for other electrode and detector designs until the five performance parameters listed above have been optimized. What is typically found during such ray tracing calculations is that the BSE trajectories change very little with changes in the electrode shapes or voltages since the BSE energies are so high (near the primary beam energy)—FIG. 12 shows that the BSE trajectories are essentially straight, largely unaffected by any of the electrodes in the detector optics. Conversely, because the SEs largely have only 1–20 eV of energy, the SE trajectories are very sensitive to small changes in both the electrode shapes and voltages. Thus, the BSE collection efficiency is essentially constant, independent of the substrate voltage, and thus independent of any charging of surface 112, while the SE collection efficiency changes rapidly with only a couple volts change in the voltage of surface 112 due to charging. Negative surface charging gives the emitted SEs (such as 602 in FIG. 6 and 702 in FIG. 7) more energy than they would have if the surface 112 were not charged—more energy tends to allow the SEs to reach the SE detector 136 more easily since the SEs are less affected by the electric fields between electrodes 104, 106, 108, 110, and the surface 112.

Figure 6:
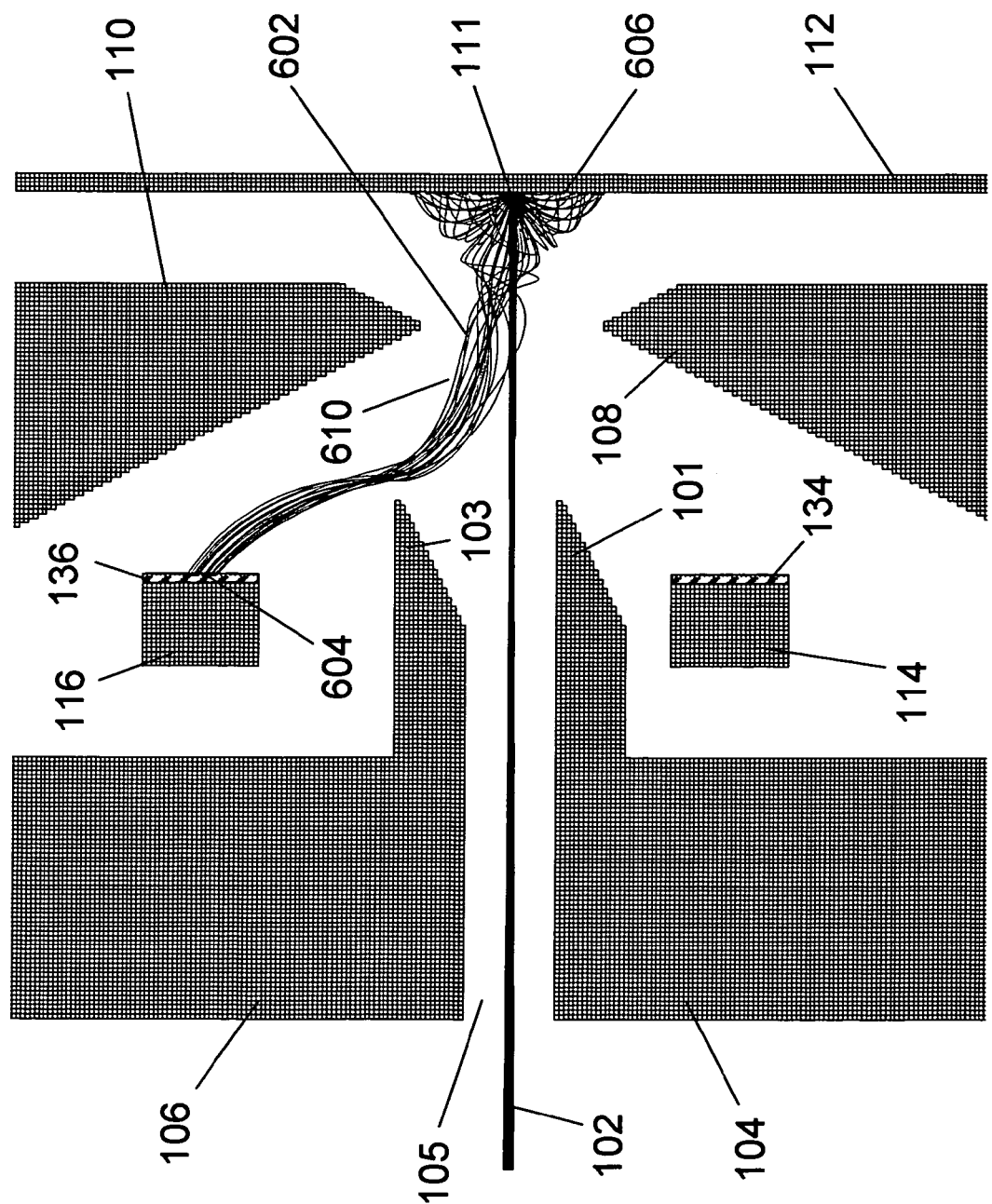
FIG. 6 is a cross-sectional representation of the dual detector optics of the present invention showing the trajectory of the primary beam incident on the substrate surface and the trajectories of 3 eV SEs leaving the substrate surface.

FIG. 6 is a cross-sectional representation of the dual detector optics of the present invention showing the trajectories of 3 eV SEs 602 which are induced by the impact of primary beam 102 at area 111 on the substrate surface 112. It has been found through extensive ray-tracing calculations that in order to achieve the desired monotonically-decreasing behavior for the collection fraction curve 906 in FIG. 9, it is necessary to have a SE collection efficiency curve 808 as shown in FIG. 8. Thus the shapes of, and voltages on, electrodes 104, 106, 108, and 110 have been optimized to achieve this result, i.e., a relatively low SE collection efficiency at 1 to 3 eV, increasing with higher SE energies to an asymptotic value of ~0.55 for SE energies above 10 eV as shown in FIG. 8. The voltages on, and shapes of, electrodes 104, 106, 108, and 110 were determined through the design optimization process described above. Portions 101 and 103 are the most important parts of the design of electrodes 104 and 106, respectively, for SE collection since only portions 101 and 103 are near the SE trajectories as can be seen from FIGS. 6 and 7. Only those SEs with emission angles (at substrate 112) <35° relative to the normal to surface 112 are able to overcome the repelling electric field induced by the −15 V difference between both electrodes 108 and 110 and the substrate 112. Once this small group of SEs has moved into region 610, it is then attracted to the SE detector 136 by the +4000 V bias (relative to substrate 112) on the SE detector 136. All the SEs with emission angles (at substrate 112) >35° relative to the normal to substrate 112 are deflected sufficiently by the bias voltages on electrodes 108 and 110 to end up back on substrate 112 as shown. None of the 3 eV SEs can reach the BSE detector 134 because the BSE detector 134 is biased −15 V relative to the substrate.

Figure 7:
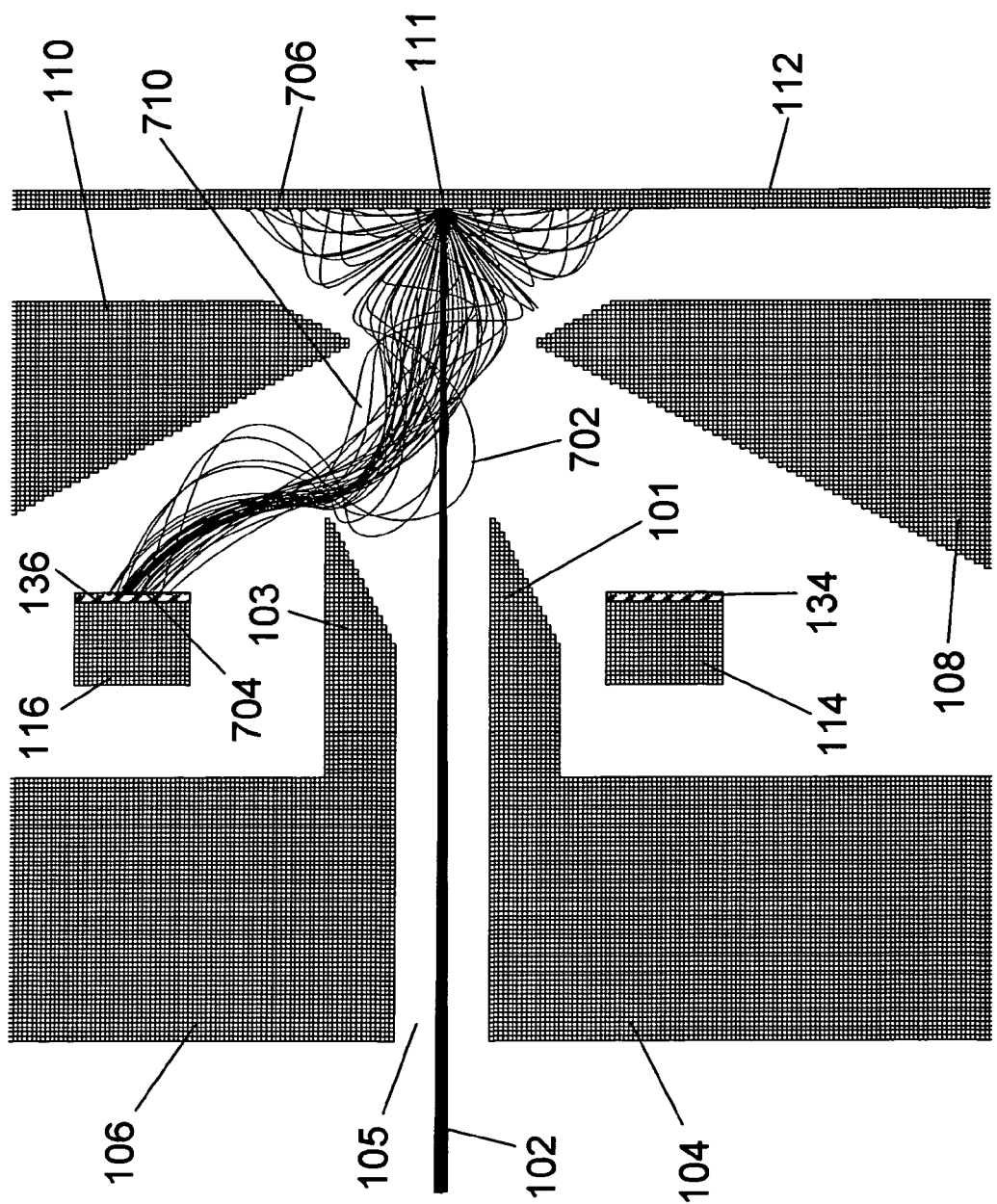
FIG. 7 is a cross-sectional representation of the dual detector optics of the present invention showing the trajectory of the primary beam incident on the substrate surface and the trajectories of 10 eV SEs leaving the substrate surface.
Figure 8:
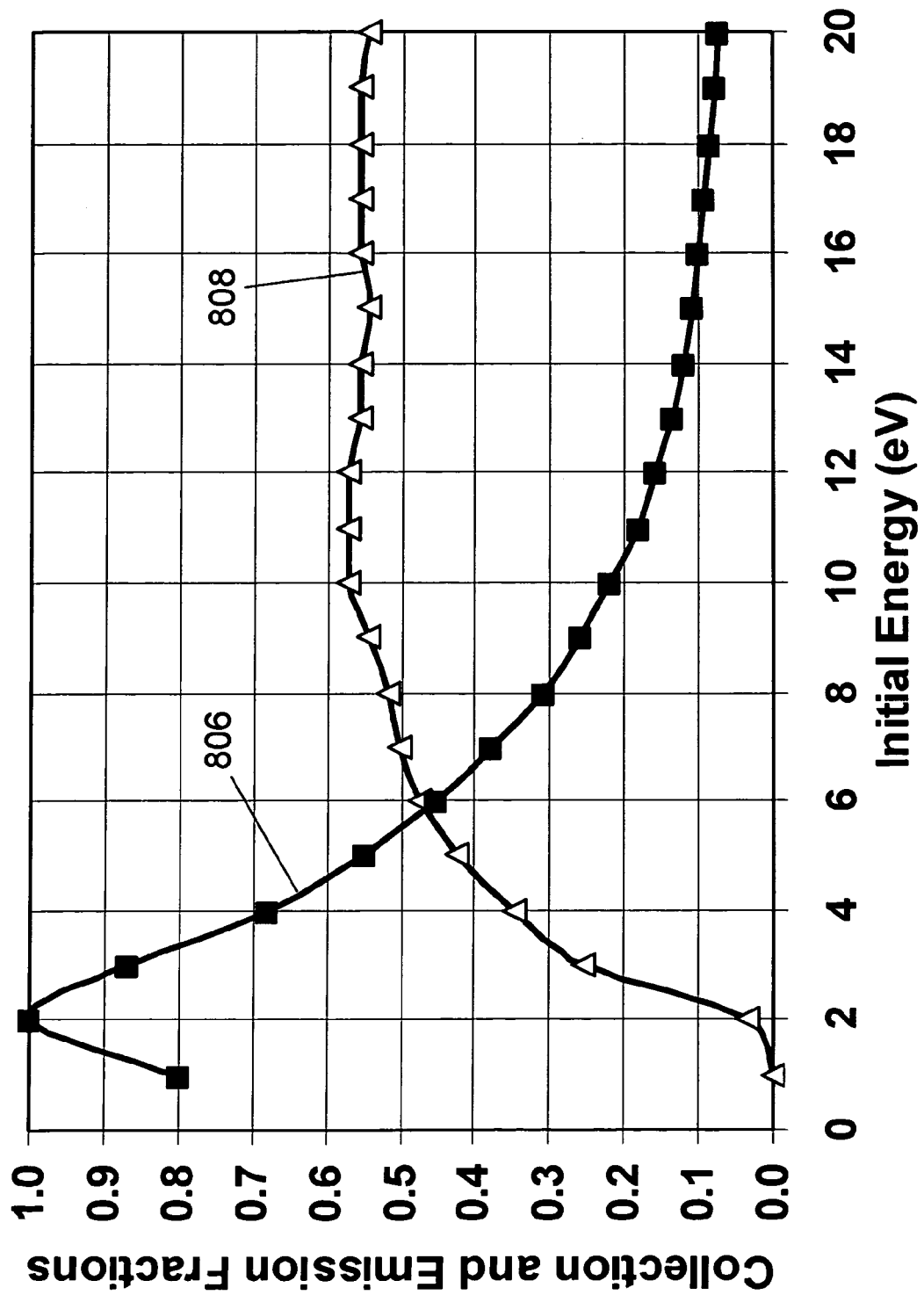
FIG. 8 is a graph of the emission and collection fractions of SEs against the initial SE energy.

FIG. 7 is a cross-sectional representation of the dual detector optics of the invention showing the trajectories of 10 eV SEs 702 which are induced by the impact of primary beam 102 at area 111 on the substrate surface 112. As described in FIG. 6, to achieve the desired monotonically-decreasing collection fraction curve 906 in FIG. 9, it is necessary for the collection efficiency curve 808 in FIG. 8 to have an asymptotic value (for SE energies ≧10 eV) of ~0.55. All the SEs which have emission angles (at substrate 112) ≧55° relative to the normal to substrate 112 are deflected sufficiently by the bias voltages on electrodes 108 and 110 to end up back on substrate 112 as shown. As shown in FIG. 7, all the SEs (about 55% of the total number of SEs) which do not land on the substrate 112 are collected by the SE detector 136 due to the +4000 V bias voltage on SE detector 136 relative to the substrate 112. None of the 10 eV SEs can reach the BSE detector 134 because the BSE detector 134 is biased −15 V relative to the substrate.

FIGS. 6 and 7 show that there is no direct cross-talk between the SE and BSE signals due to the SEs, i.e., none of the SEs are collected by the BSE detector. FIG. 8 shows a graph of the SE collection efficiency 808 and SE emission distribution 806 against the initial SE energy. Curve 806 is a function only of the material emitting the SEs 602 from area 111 in FIG. 6 and the SEs 702 from area 111 in FIG. 7, and has a pronounced peak at 2 eV, with a rapid drop-off towards 20 eV, which is the cut-off for the calculations. Data for curve 806 may be found in the published literature, such as on p. 153 of Reimer, L., *Scanning Electron Microscopy*, $2^{nd}$ ed., Springer-Verlag, 1998, ISBN 3-540-63976-4. Curve 808 is a function only of the design of the detector optics. Curve 808 is obtained by performing a series of ray-tracing calculations, at SE energies of 1, 2 . . . , 20 eV and determining for each SE energy the fraction of SEs which are collected by the SE detector 136. This particular shape for curve 808 gives the desired dependence of collection fraction against substrate charging voltage shown in FIG. 9. Higher collection efficiencies for lower (<6 eV) energy SEs would increase the overall collection percentage against the substrate charging voltage, but at the expense of flattening the curve for charging voltages <0 V, thereby reducing signal linearity over the −4 V to +4 V range shown in FIG. 9.

Figure 9:
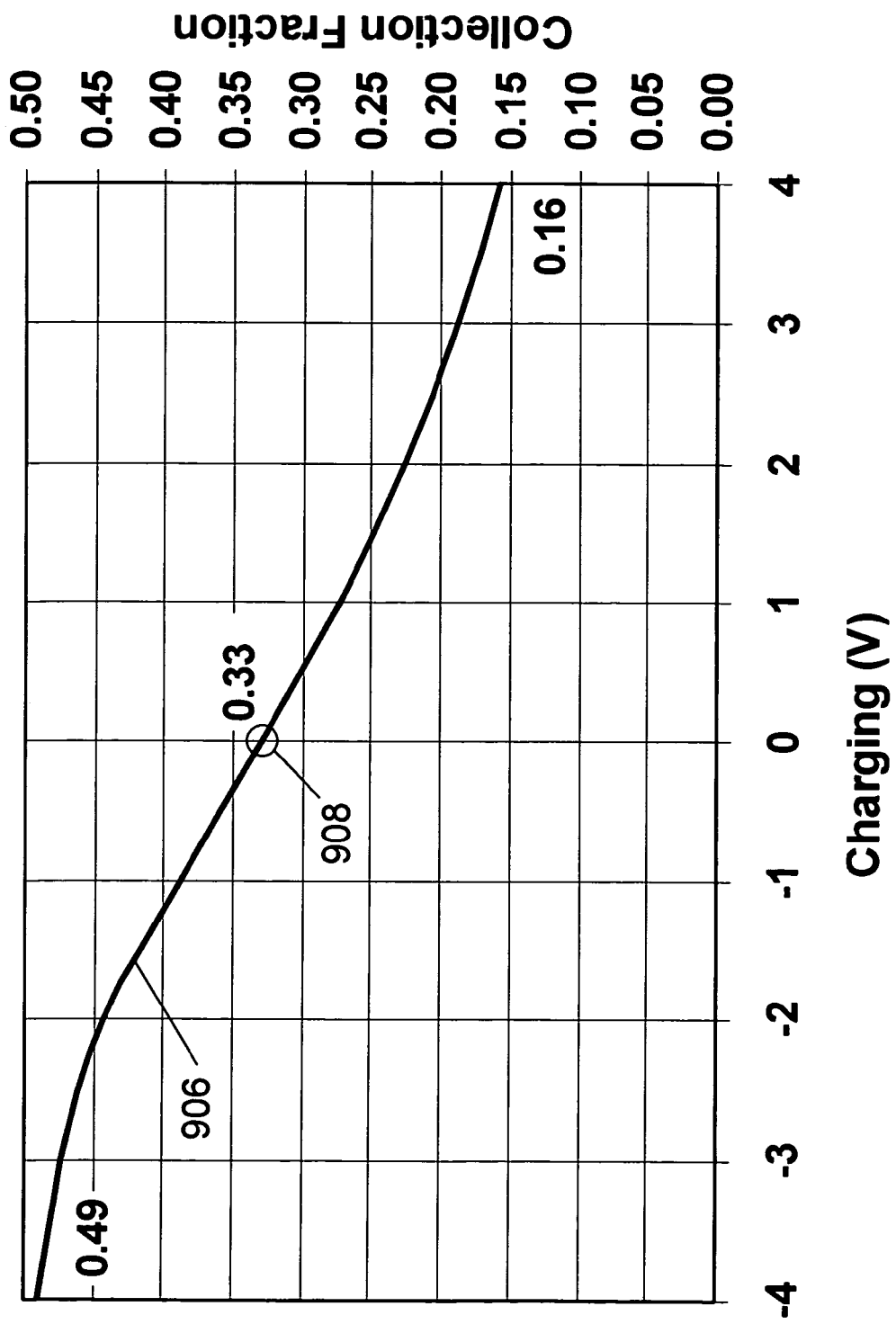
FIG. 9 is a graph of the SE collection fraction against the substrate charging voltage.

FIG. 9 shows a graph of the secondary electron collection fraction 906 against the charging voltage on the substrate 112 in FIGS. 6 and 7. Curve 906 decreases monotonically from −4 V charging (=0.49 collection fraction) to +4 V charging (=0.16 collection fraction). For no charging (0 V at point 908), the collection fraction=0.33. The collection fraction curve 906 in FIG. 9 is calculated using eqs. (1)–(7):

$E_{init}$ = initial secondary electron (SE) energy (1 to 20 eV, in steps of 1 eV) (1)

$E_{charging}$ = e[charging voltage at surface](−4 to +4 eV, in steps of 1 eV) (2)

$S(E_{init})$ = SE emission distribution 806 (normalized to 1.0 at 2 eV) (3)

$C(E)$ = SE collection efficiency, where $E = E_{init} - E_{charging}$ (4)

= 0 for $E < 0$ eV or $E > 20$ eV (5)

= curve 808 for 0 eV ≤ E ≤ 20 eV (6)

Then $P(E_{charging})$=collection fraction 906 is calculated with equation (7):

$$P(E_{charging}) \equiv \sum_{\text{from } E_{init} = 0 \text{ eV}}^{\text{to } E_{init} = 20 \text{ eV}} S(E_{init})C(E_{init} - E_{charging}) \quad (7)$$

Figure 10:
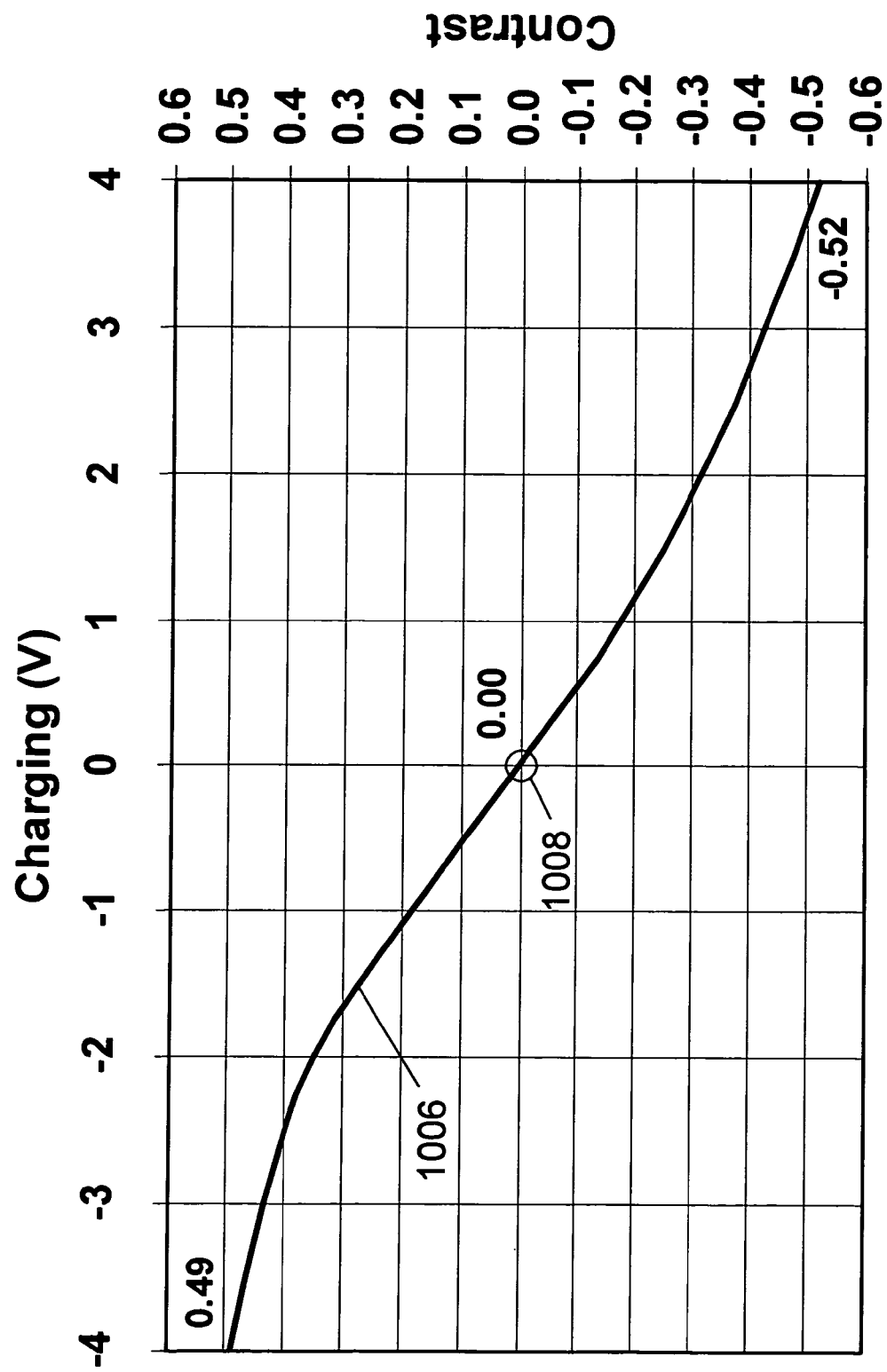
FIG. 10 is a graph of the SE contrast against the substrate charging voltage.

FIG. 10 shows a graph of the contrast against the charging voltage on the substrate 112 in FIGS. 6 and 7. "Contrast" corresponds to the relative signal strength for a given amount of substrate charging compared with the signal strength for no charging (point 1008), as calculated with eqs. (8)–(10):

$I(V_{charging})$=signal intensity with a charging voltage $V_{charging}$ (8)

$I(0)$=signal intensity with no charging (9)

Contrast $(V_{charging}) \equiv [I(V_{charging}) - I(0)]/I(0)$ (10)

Curve 1006 has the same shape as curve 906, but it passes through the origin 1008 of the graph. From FIG. 9, for −4 V charging (net accumulation of electrons), the collection fraction is 0.49 (compared with 0.33 at point 908), giving a contrast of:

Contrast at −4 V=(0.49−0.33)/0.33=0.49 (11)

For +4 V charging (net deficit of electrons), the collection fraction drops to 0.16, giving a relative contrast of:

Contrast at +4 V=(0.16−0.33)/0.33=−0.52 (12)

Curves 906 and 1006 result from the effects of changes in the detector optics collection efficiency—no account is taken of possible additional effects due to local topography on the substrate surface 112.

The way the method of the present invention distinguishes pre-charged areas is that immediately upon illuminating a pre-charged area with the primary beam, the ratio of SE to BSE signals will reflect the local charging of the substrate—i.e., it will show what the surface voltage has become due to pre-charging. Thus, in order to test the pixel capacitor for leakage, connections, etc., the test system will start from a known voltage (which may not be 0 V) and will then be able to measure ΔV from this known initial voltage.

Curve 1006 in FIG. 10 can be used to demonstrate the data precision possible in measuring the absolute voltage using the SE signal. Assuming the Contrast signal is digitized with a 12-bit analog-to-digital converter (ADC), then we assign a contrast of 0.0 (at charging voltage=0.0 V) the value of 2048 (at the mid-point of the total range=0 to 4095). At −1.1 V charging, curve 1006 shows that the contrast is 0.2, giving a value of:

ADC Output=(Midpoint Value)+(Contrast) (2048) (13)

ADC Output=(2048)+(0.2)(2048)=2458 (14)

This change in the ADC output of 410 digitization steps, corresponding to −1.1 V substrate charging, gives a least-significant-bit (LSB) change of:

LSB (in V)=(1.1 V)/410=2.7 mV (15)

This LSB change represents the smallest voltage increment measurable with a 12-bit ADC, assuming that electrical noise in the analog circuit preceding the ADC is substantially less than 2.7 mV.

Figure 11:
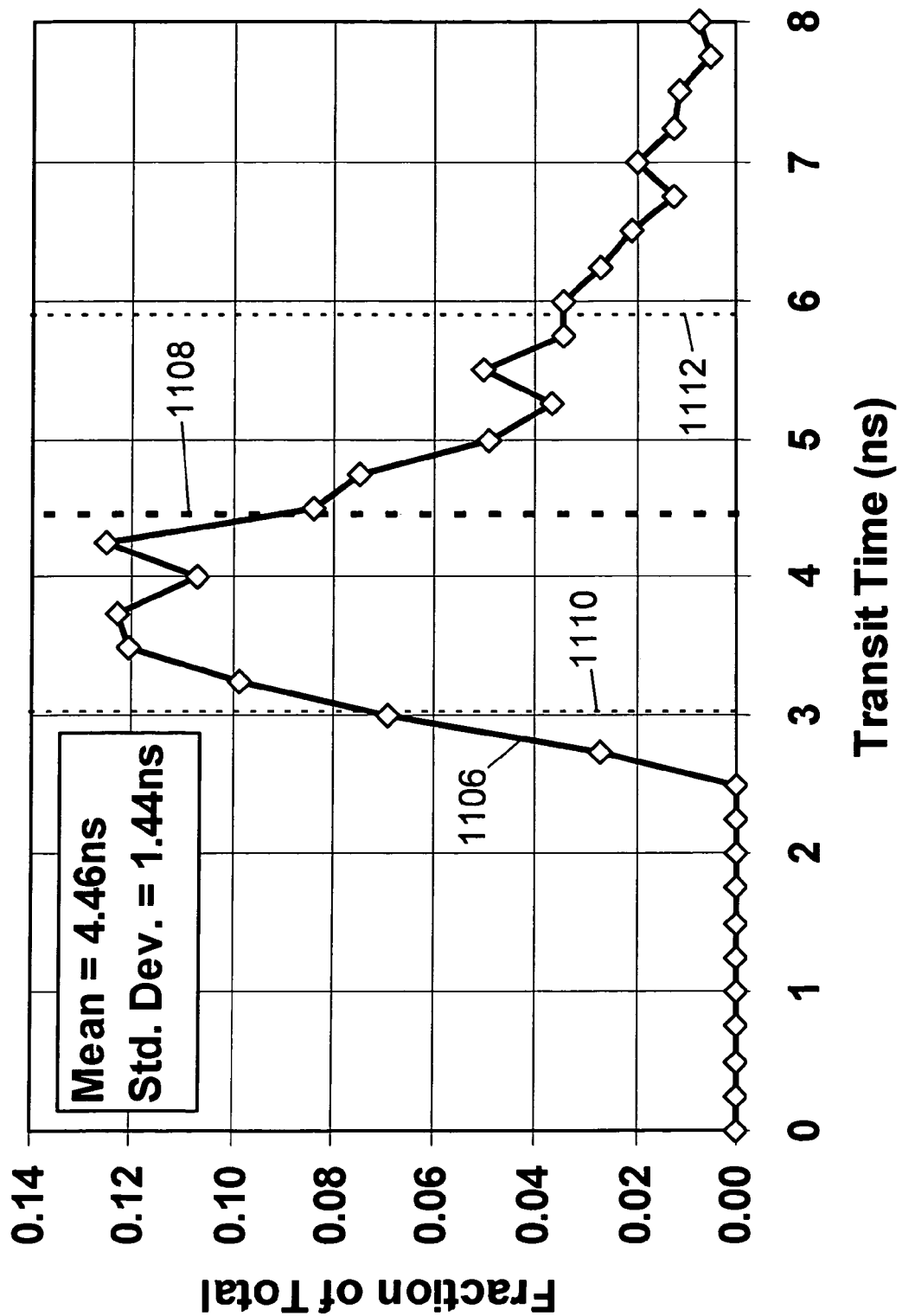
FIG. 11 is a graph of the fraction of the total SE signal against the SE transit time from the substrate to the SE detector.

FIG. 11 is a graph of the fraction of SEs arriving at the SE detector 136 in FIGS. 6 and 7 against the transit time of the SEs from the substrate surface 112 to the SE detector 136. The mean transit time 1108 is 4.46 ns, with a standard deviation σ of 1.44 ns (−σ transit time is line 1110 and +σ transit time is line 1112). Curve 1106 shows that the bulk of the SEs arrive at SE detector 136 within 3 to 6 ns of emission from the substrate surface 112. The limit on the maximum detector bandwidth imposed by the SE transit time is given by eqs. (16) and (17):

$$\text{Maximum Bandwidth} = 1/(\text{max time} - \text{min time}) \quad (16)$$

$$= 1/(6 \text{ ns} - 3 \text{ ns}) \approx 333 \text{ MHz} \quad (17)$$

For the demands of flat panel display substrate testing, 333 MHz is more than adequate, since sample times are typically >1 µs.

An example of an energy spectrum of BSEs against the ratio $E/E_B$, where E=the BSE energy and $E_B$=the energy of the primary electron beam (20 keV), is shown on p. 149 of Reimer, L., *Scanning Electron Microscopy*, $2^{nd}$ ed., Springer-Verlag, 1998, ISBN 3-540-63976-4. Typically, graphs of the BSE energy spectrum against the ratio $E/E_B$ found in the literature show that the majority of BSEs have energies near the primary beam energy. For higher atomic number (Z) materials, the graph shows that the energy distributions of BSEs are more concentrated near the primary beam energy.

A polar diagram of the BSE angular distribution for primary electrons incident on the substrate surface at an angle ϕ=80° to the surface normal is shown on p. 147 of Reimer, L., *Scanning Electron Microscopy*, $2^{nd}$ ed., Springer-Verlag, 1998, ISBN 3-540-63976-4. For gold, the BSE angular distribution is generally centered around the specular reflection angle to the surface. As the primary beam energy is increased, the angular distribution becomes narrower, remaining centered around the specular reflection angle. The scattering distributions are also narrower for lower atomic number substrates.

FIG. 12 is a cross-sectional representation of the dual detector optics of the present invention showing the trajectories of 2000 eV BSEs 1202 leaving from area 111 on the substrate surface 112. The BSEs 1202 in FIG. 12 correspond to electrons from the primary beam 102 in FIG. 1, which have scattered off nuclei in the substrate 112 and subsequently exit back out of the substrate 112. The BSEs 1202 generally have energies close to that of the primary beam 102. The energies of the BSEs 1202 are much higher than the electron charge, e, times the voltage differences between the substrate 112, electrodes 104, 106, 108, 110, BSE detector 134, and BSE detector support 114. Thus, the BSE trajectories are approximately straight lines until each BSE strikes some surface within the detector optics. Table I shows fractions of BSEs which strike twelve different areas within the detector optics.

TABLE I

Distribution of backscattered electrons on detector optics electrodes

| | Fraction of BSEs | Area in FIG. 12 |
|---|---|---|
| Substrate electric-field control (SEFC) electrode 110 bottom | 0.067 | 1204 |
| SEFC electrode 110 chamfered area 121 | 0.174 | 1208 |
| SE detector 136 | 0.000 | |
| SE detector support 116 side | 0.081 | 1212 |
| FFT electrode 106 chamfered area 115 | 0.148 | 1214 |
| Field-Free Tunnel (FFT) 105 and FFT walls 107 and 109 | 0.101 | 1218 |
| FFT electrode 104 chamfered area 113 | 0.067 | 1216 |
| Behind BSE detector support 114 | 0.013 | 1222 |
| BSE detector support 114 side | 0.034 | 1224 |
| BSE detector 134 (=BSE signal) | 0.087 | 1220 |

TABLE I-continued

Distribution of backscattered electrons on detector optics electrodes

| | Fraction of BSEs | Area in FIG. 12 |
|---|---|---|
| SEFC electrode 108 chamfered area 119 | 0.161 | 1210 |
| SEFC electrode 108 bottom | 0.067 | 1206 |
| TOTALS | 1.000 | |

Figure 13:
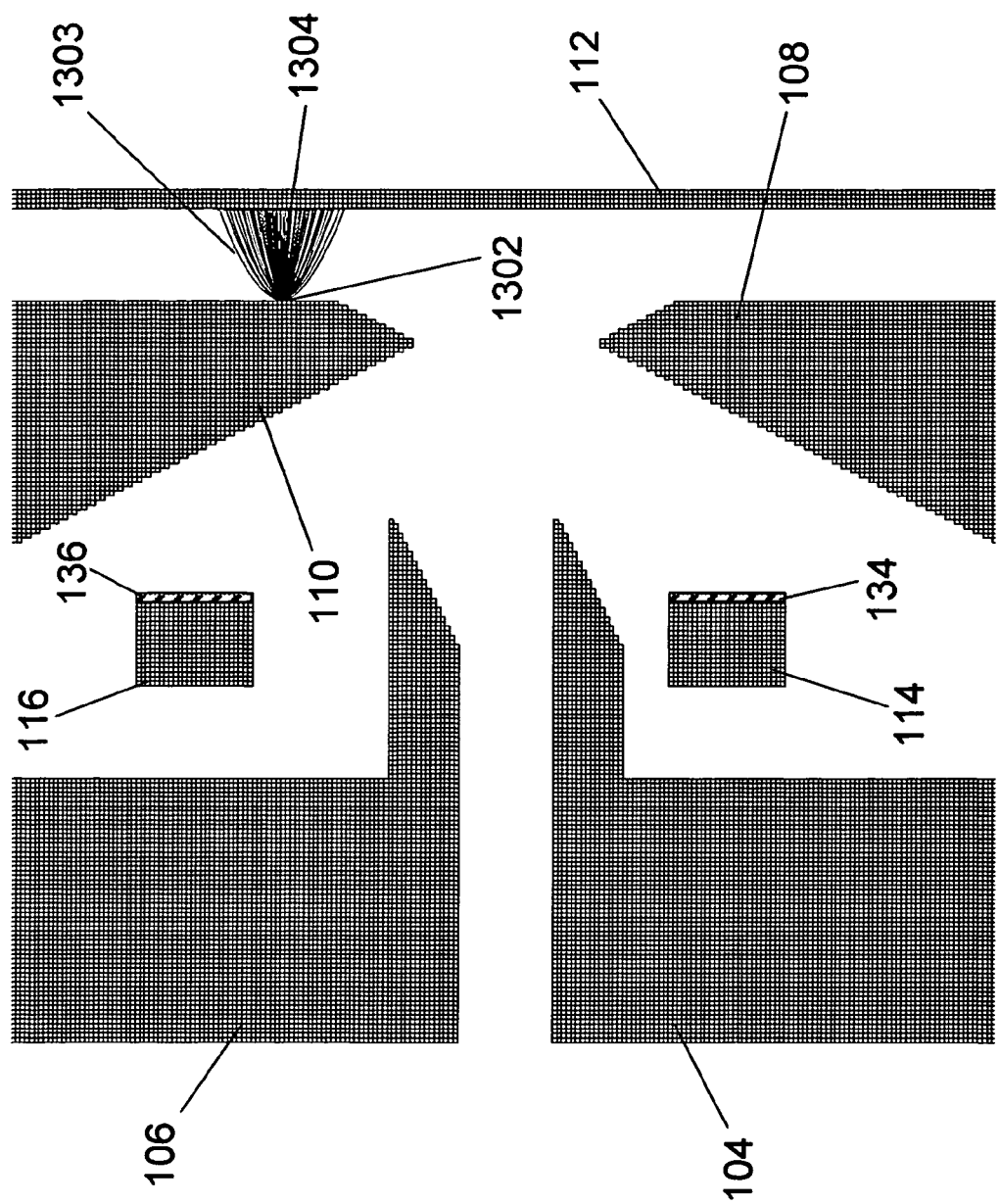
FIG. 13 is a cross-sectional representation of the dual detector optics of the present invention showing the trajectories of 2 eV SEs leaving from area 1302 on substrate electric-field control electrode 110.

FIG. 13 is a cross-sectional representation of the dual detector optics of the present invention showing the trajectories of 2 eV SEs 1303 leaving from area 1302 on substrate electric-field control (SEFC) electrode 110. The SEs 1303 are induced by the impact of BSEs 1202 which strike area 1204 in FIG. 12. All of the SEs 1303 end up on the substrate surface 112 at area 1304. Note that the SE emission distribution follows Lambert's Law, giving a cosine distribution centered around the local normal to the lower surface of the SEFC electrode 110.

Figure 14:
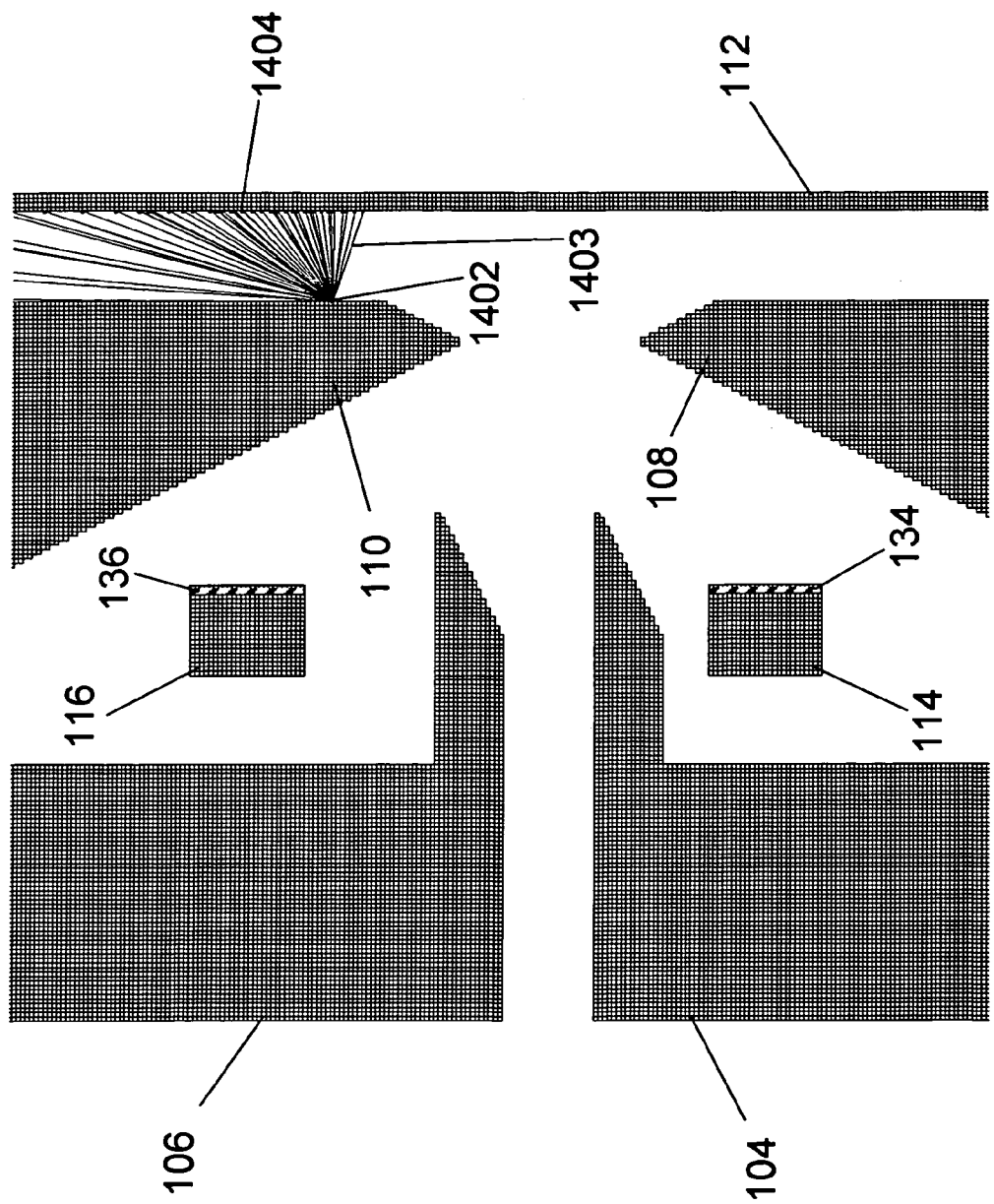
FIG. 14 is a cross-sectional representation of the dual detector optics of the present invention showing the trajectories of 2000 eV BSEs leaving from area 1402 on substrate electric-field control electrode 110.

FIG. 14 is a cross-sectional representation of the dual detector optics of the present invention showing the trajectories of 2000 eV BSEs 1403 leaving from area 1402 on SEFC electrode 110. The BSEs 1403 are induced by the impact of BSEs 1202 which strike area 1204 in FIG. 12. BSEs 1403 will scatter away from area 111 in FIG. 12 since the specular reflection angles of the BSEs striking area 1204 are directed away from area 111. All of the BSEs 1403 eventually strike the substrate surface 112 at area 1404.

Figure 15:
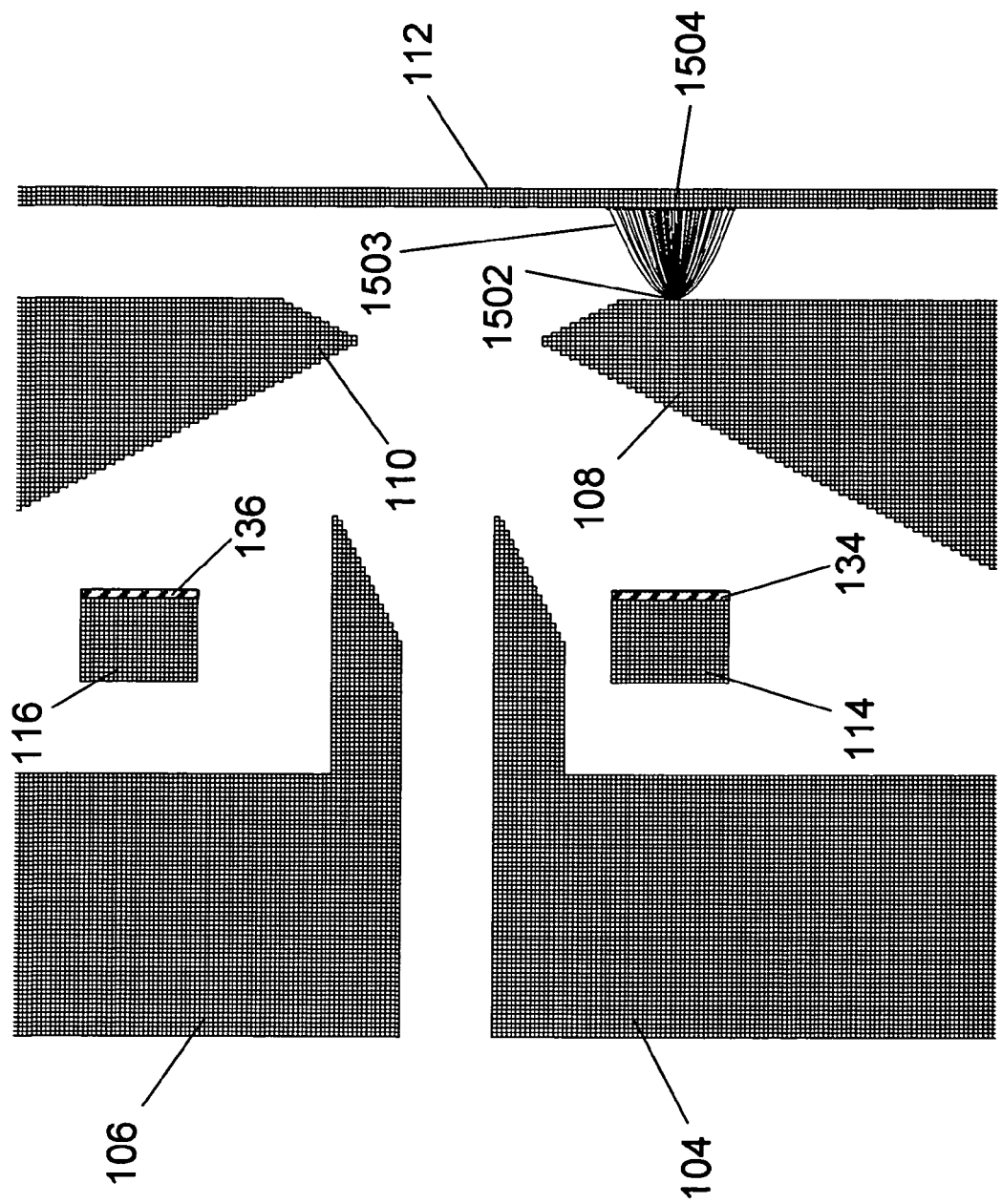
FIG. 15 is a cross-sectional representation of the dual detector optics of the present invention showing the trajectories of 2 eV SEs leaving from area 1502 of substrate electric-field control electrode 108.

FIG. 15 is a cross-sectional representation of the dual detector optics of the present invention showing the trajectories of 2 eV SEs 1503 leaving from area 1502 on SEFC electrode 108. The SEs 1503 are induced by the impact of BSEs 1202 which strike area 1206 in FIG. 12. All of the SEs 1503 end up on the substrate surface 112 at area 1504.

Figure 16:
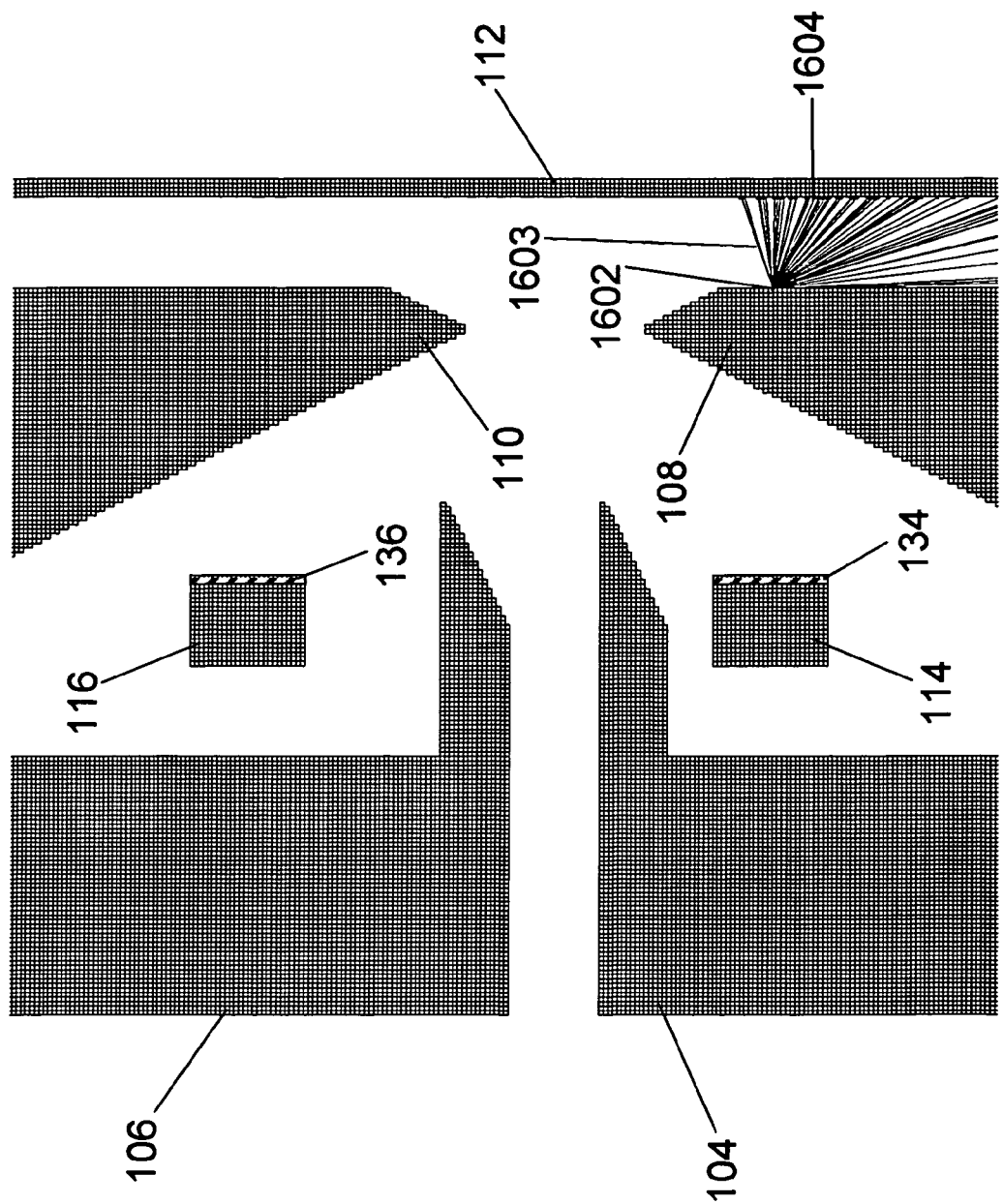
FIG. 16 is a cross-sectional representation of the dual detector optics of the present invention showing the trajectories of 2000 eV BSEs leaving from area 1602 on substrate electric-field control electrode 108.

FIG. 16 is a cross-sectional representation of the dual detector optics of the present invention showing the trajectories of 2000 eV BSEs 1603 leaving from area 1602 on SEFC electrode 108. The BSEs 1603 are induced by the impact of BSEs 1202 which strike area 1206 in FIG. 12. BSEs 1603 will scatter away from area 111 in FIG. 12 since the specular reflection angles of the BSEs striking area 1206 are directed away from area 111. All of the BSEs 1603 eventually strike the substrate surface 112 at area 1604.

Figure 17:
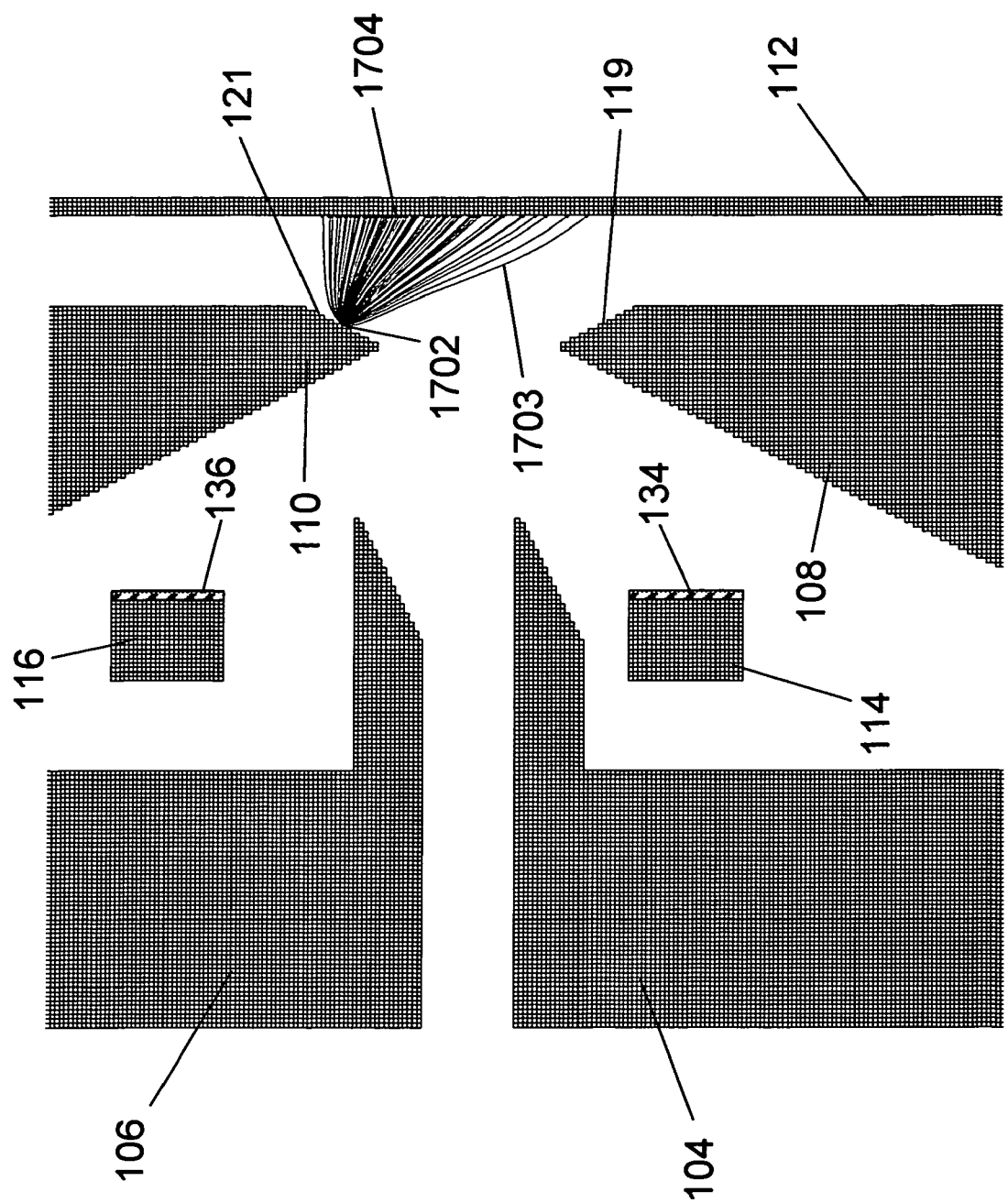
FIG. 17 is a cross-sectional representation of the dual detector optics of the present invention showing the trajectories of 2 eV SEs leaving from area 1702 on substrate electric-field control electrode 110.

FIG. 17 is a cross-sectional representation of the dual detector optics of the present invention showing the trajectories of 2 eV SEs 1703 leaving from area 1702 on the chamfered area 121 of SEFC electrode 110. The SEs 1703 are induced by the impact of BSEs 1202 which strike area 1208 in FIG. 12. All of the SEs 1703 end up on the substrate surface 112 at area 1704. Note that the SE emission distribution follows Lambert's Law, giving a cosine distribution centered around the local normal to the chamfered area 121 of SEFC electrode 110.

Figure 18:
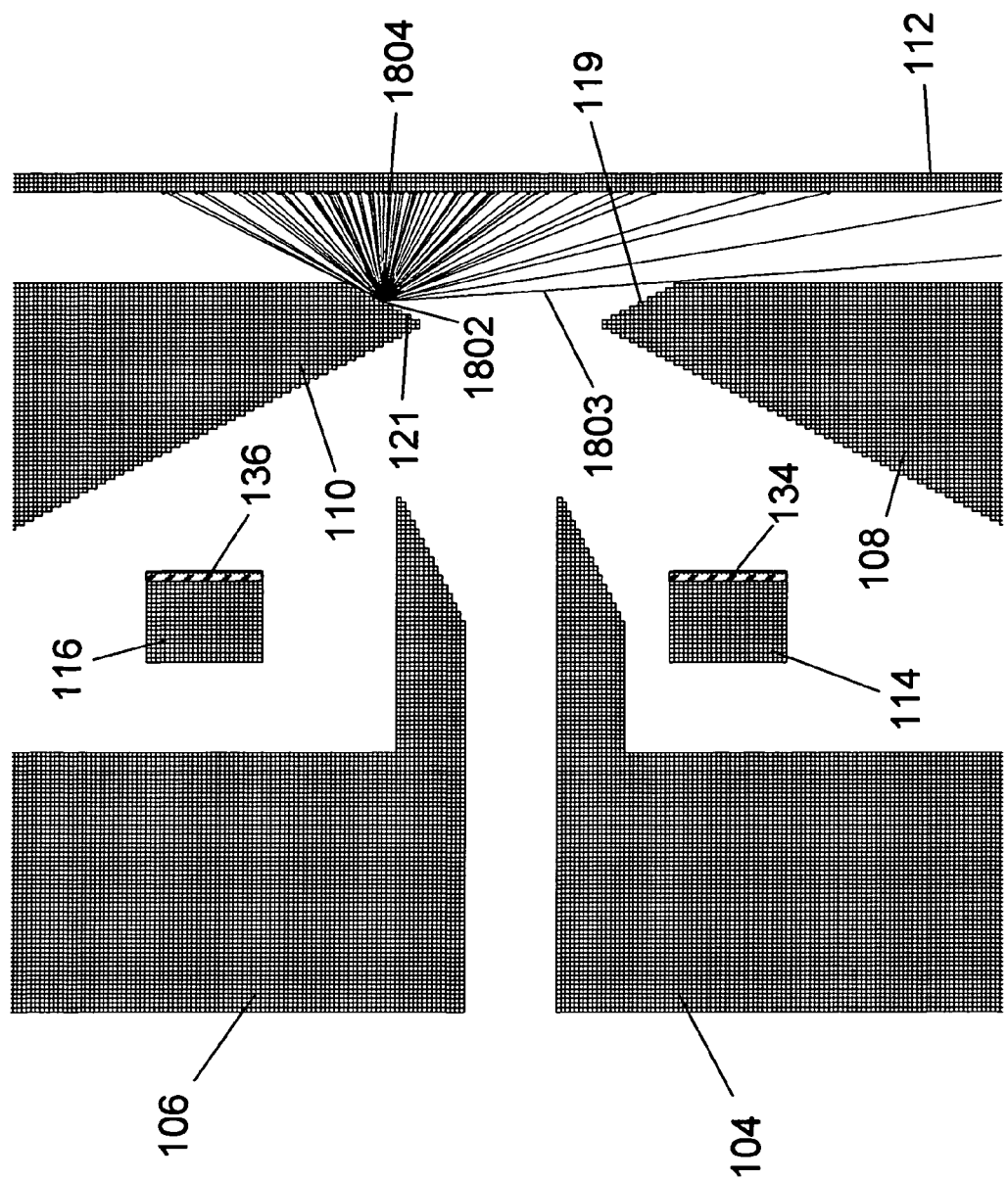
FIG. 18 is a cross-sectional representation of the dual detector optics of the present invention showing the trajectories of 2000 eV BSEs leaving from area 1802 on substrate electric-field control electrode 110.

FIG. 18 is a cross-sectional representation of the dual detector optics of the present invention showing the trajectories of 2000 eV BSEs 1803 leaving from area 1802 on the chamfered area 121 of SEFC electrode 110. The BSEs 1803 are induced by the impact of BSEs 1202 which strike area 1208 in FIG. 12. Almost all of the BSEs 1803 strike the substrate surface 112 at area 1804.

Figure 19:
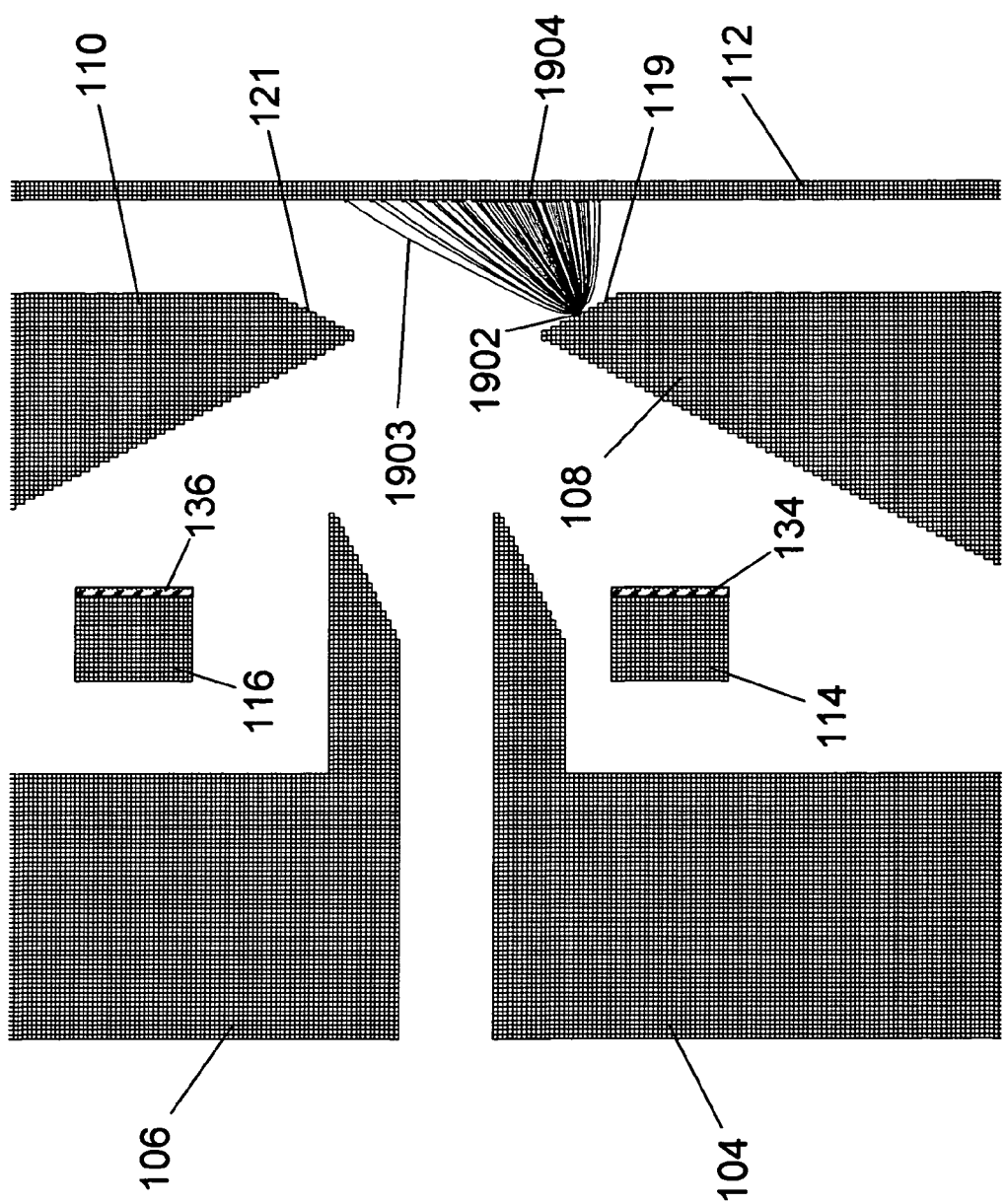
FIG. 19 is a cross-sectional representation of the dual detector optics of the present invention showing the trajectories of 2 eV SEs leaving from area 1902 on substrate electric-field control electrode 108.

FIG. 19 is a cross-sectional representation of the dual detector optics of the present invention showing the trajectories of 2 eV SEs 1903 leaving from area 1902 on the chamfered area 119 of SEFC electrode 108. The SEs 1903 are induced by the impact of BSEs 1202 which strike area 1210 in FIG. 12. All of the SEs 1903 end up on the substrate surface 112 at area 1904.

Figure 20:
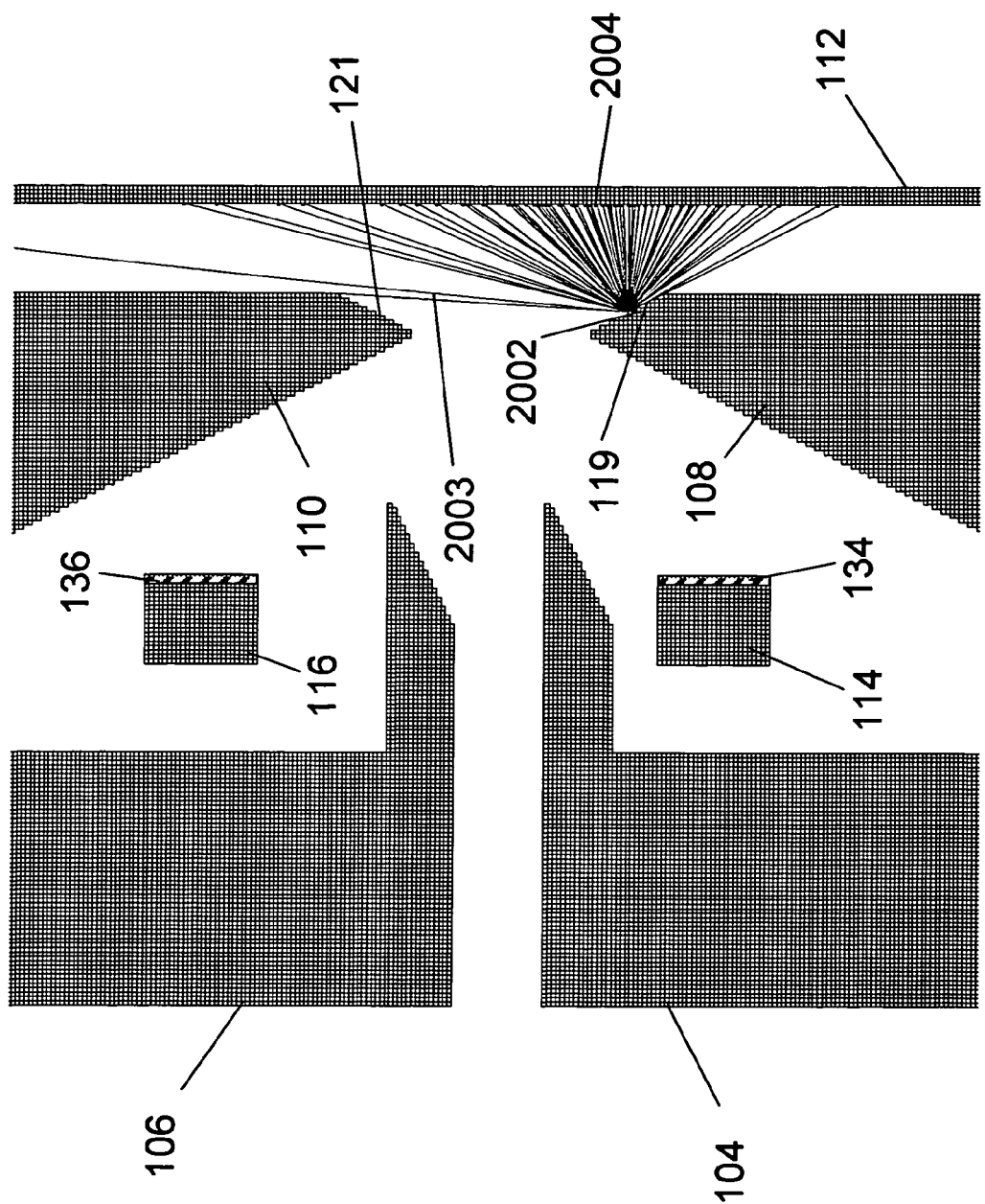
FIG. 20 is a cross-sectional representation of the dual detector optics of the present invention showing the trajectories of 2000 eV BSEs leaving from area 2002 on substrate electric-field control electrode 108.

FIG. 20 is a cross-sectional representation of the dual detector optics of the present invention showing the trajectories of 2000 eV BSEs 2003 leaving from area 2002 on the chamfered area 119 of SEFC electrode 108. The BSEs 2003 are induced by the impact of BSEs 1202 which strike area 1210 in FIG. 12. Almost all of the BSEs 2003 strike the substrate surface 112 at area 2004.

Figure 21:
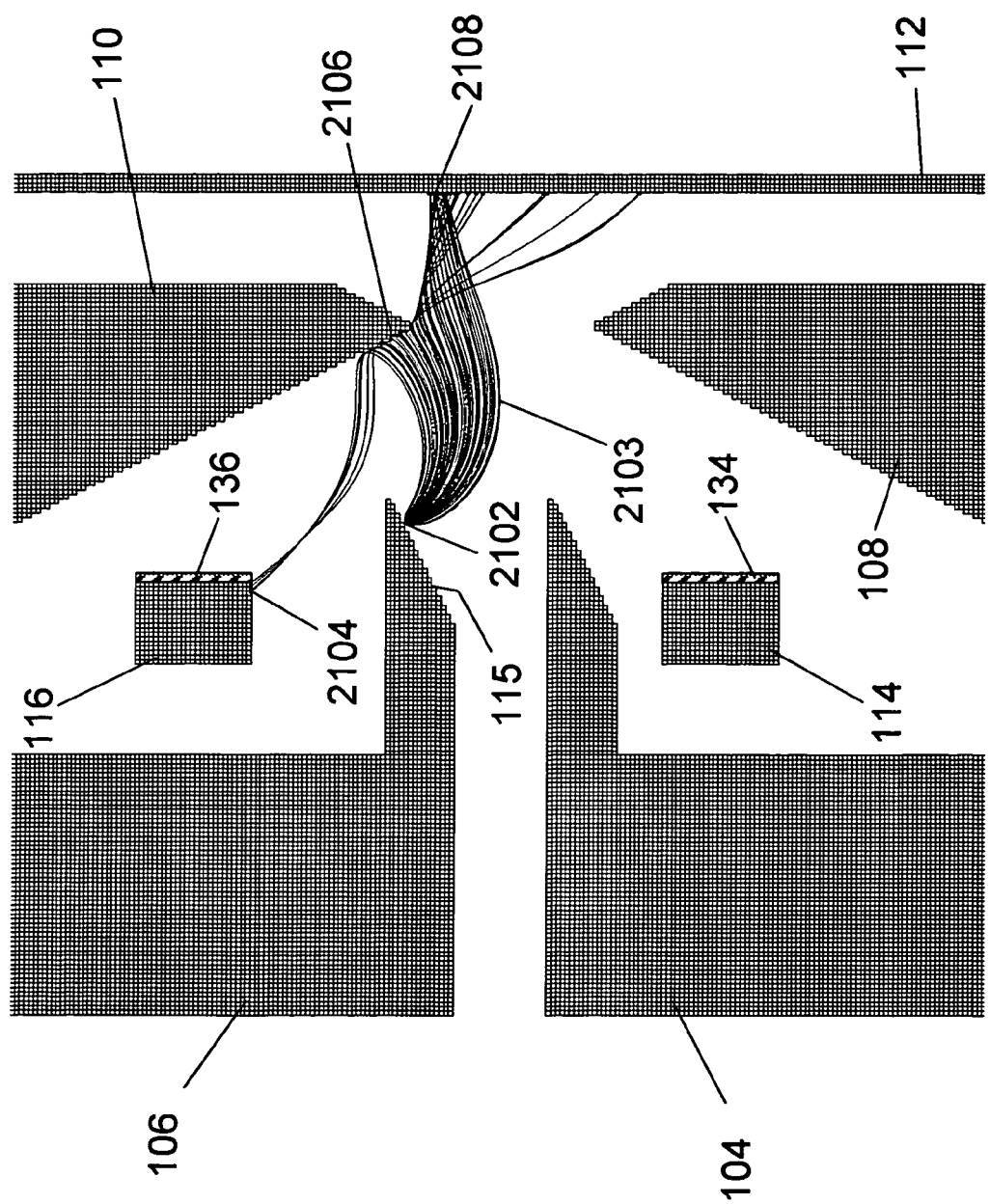
FIG. 21 is a cross-sectional representation of the dual detector optics of the present invention showing the trajectories of 2 eV SEs leaving from area 2102 on field-free tunnel electrode 106.

FIG. 21 is a cross-sectional representation of the dual detector optics of the present invention showing the trajectories of 2 eV SEs 2103 leaving from area 2102 on the chamfered area 115 of field-free tunnel (FFT) electrode 106. SEs 2103 are induced by the impact of BSEs 1202 which strike area 1214 in FIG. 12. The majority of SEs 2103 end up on the substrate surface 112 at area 2108. A small fraction of the SEs 2103 strike the side of the SE detector support 116 nearest FFT electrode 106 and another small fraction strikes the upper surface of SEFC electrode 110. Note that the SE emission distribution follows Lambert's Law, giving a cosine distribution centered around the local normal to the chamfered area 115 of FFT electrode 106.

Figure 22:
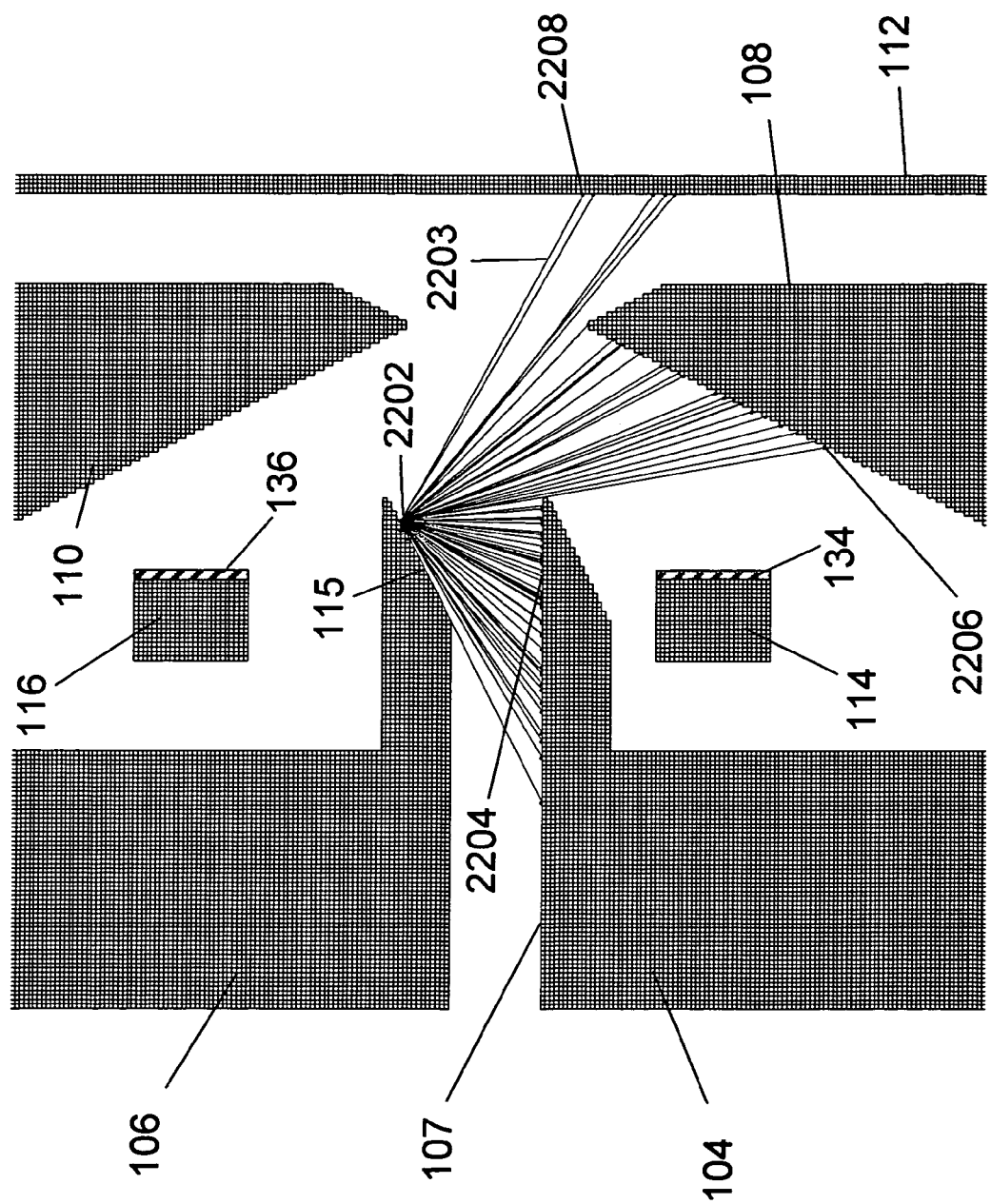
FIG. 22 is a cross-sectional representation of the dual detector optics of the present invention showing the trajectories of 2000 eV BSEs leaving from area 2202 on field-free tunnel electrode 106.

FIG. 22 is a cross-sectional representation of the dual detector optics of the present invention showing the trajectories of 2000 eV BSEs 2203 leaving from area 2202 on the chamfered area 115 of FFT electrode 106. BSEs 2203 are induced by the impact of BSEs 1202 which strike area 1214 in FIG. 12. The majority of the BSEs 2203 strike the inner wall 107 of FFT electrode 104 at area 2204. Most of the remaining BSEs 2203 strike the upper surface of SEFC electrode 108 at area 2206. A small number of BSEs 2203 strike the substrate surface 112 at area 2208.

Figure 23:
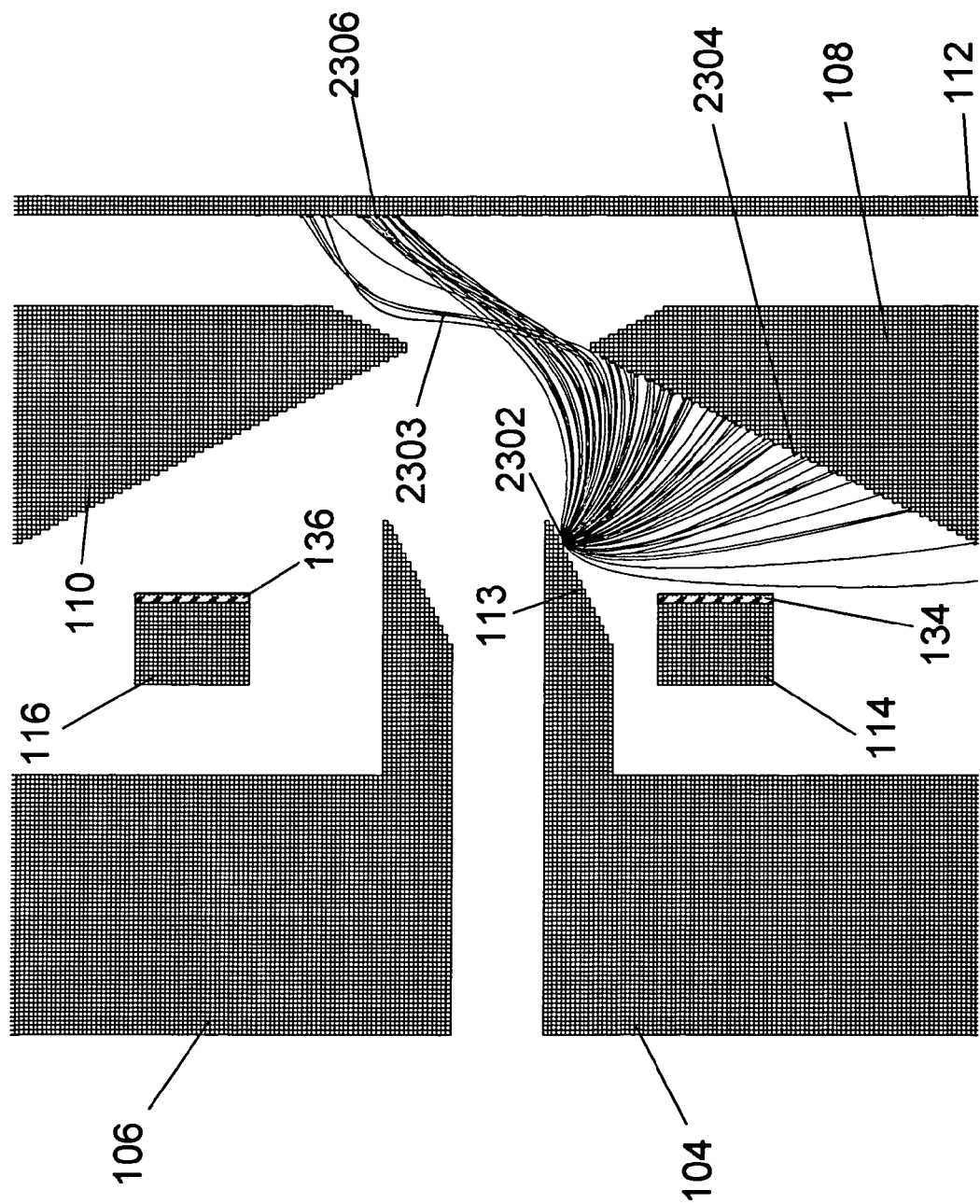
FIG. 23 is a cross-sectional representation of the dual detector optics of the present invention showing the trajectories of 2 eV SEs leaving from area 2302 on field-free tunnel electrode 104.

FIG. 23 is a cross-sectional representation of the dual detector optics of the present invention showing the trajectories of 2 eV SEs 2303 leaving from area 2302 on the chamfered area 113 of FFT electrode 104. SEs 2303 are induced by the impact of BSEs 1202 which strike area 1216 in FIG. 12. The majority of SEs 2303 end up on the upper surface of SEFC electrode 108 at area 2304. A smaller fraction of SEs 2303 strike the substrate surface 112 at area 2306.

Figure 24:
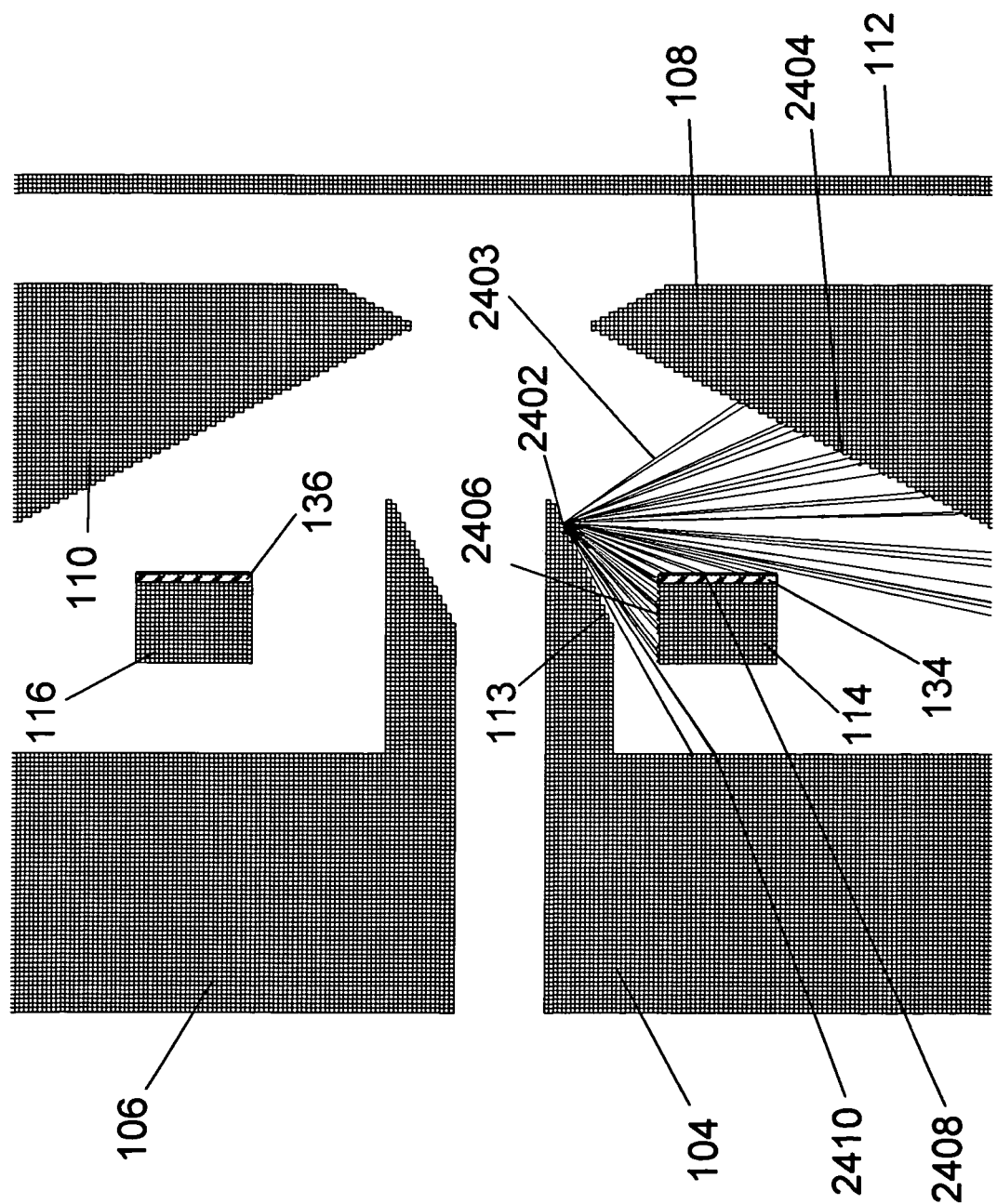
FIG. 24 is a cross-sectional representation of the dual detector optics of the present invention showing the trajectories of 2000 eV BSEs leaving from area 2402 on field-free tunnel electrode 104.

FIG. 24 is a cross-sectional representation of the dual detector optics of the present invention showing the trajectories of 2000 eV BSEs 2403 leaving from area 2402 on the chamfered area 113 of FFT electrode 104. BSEs 2403 are induced by the impact of BSEs 1202 which strike area 1216 in FIG. 12. The majority of the BSEs 2403 strike either the BSE detector 134 at area 2408, or the side of the BSE detector support 114 at area 2406. A smaller fraction of BSEs 2403 end up on the upper surface of SPEC electrode 108 at area 2404. A small number of BSEs 2403 strike behind BSE detector support 114 at area 2410. Note that the BSEs striking the BSE detector 134 at area 2408 arise from BSEs 1202 coming from the substrate surface 112 at area 111 (see FIG. 12) and thus do not represent cross-talk between the SE and BSE signals. In fact, there is a slight enhancement in the BSE detection efficiency caused by this effect.

The overall BSE collection efficiency is determined by the fraction (=0.087 from Table I) of the total BSE emission which strikes the BSE detector 134. Table I also shows that no BSEs strike the SE detector 136, thus there is no direct cross-talk between the SE and BSE signals due to the BSEs. Since no SEs strike the BSE detector 134, either, there is no direct cross-talk between the SE and BSE signals at all.

FIGS. 13 through 24 demonstrate that there is no indirect cross-talk between the SE and BSE signals. Therefore there is no direct or indirect cross-talk between the SE and BSE signals within the detector optics of the present invention.

The detector optics design of the present invention has the following features:

1. Chamfers 113 and 115 on the lower portions 101 and 103 of FFT electrodes 104 and 106, respectively—chamfers 113 and 115 "steer" BSEs away from SE detector 136.
2. Chamfers 119 and 121 on SEFC electrodes 108 and 110, respectively—chamfers 119 and 121 "steer" BSEs down towards the substrate and away from SE detector 136.
3. SE detector 136 and BSE detector 134 located on opposite sides of the field-free tunnel 105—this makes it easier to ensure that only SEs are collected by the SE detector 136, and that only BSEs are collected by the BSE detector 134.
4. The voltage settings on the substrate 112, SEFC electrodes 108 and 110, FFT electrodes 104 and 106, SE detector 136, SE detector support 116, BSE detector 134 and BSE detector support 114, are adjusted to shape the SE collection efficiency curve 808 in FIG. 8 to give the monotonically-decreasing collection fraction curve 906 in FIG. 9. This voltage adjustment is done using ray-tracing calculations in an iterative process of successive voltage variations until the desired curve shape 906 has been obtained.

While the present invention has been described with reference to particular embodiments, this description is solely for the purpose of illustration and is not to be construed as limiting the scope of the present invention claimed below. For example, the detector optics of this invention can be integrated into a variety of electron beam columns, including columns with magnetic lenses. Furthermore, the detector optics assembly of this invention can be incorporated into a variety of systems, including electron beam lithography systems, electron microscopes, and other analytical systems utilizing electron beams.

The detector optics design illustrated in FIG. 1 has planar symmetry—i.e., electrodes 104, 106, 108, 110, detectors 134 and 136, and detector supports 114 and 116 all have the same shapes in every cross-sectional plane parallel to the cross-sectional plane shown in FIG. 1. However, it is also possible to implement the dual detector concept of the present invention in cylindrical symmetry such as that found in conventional single-beam electron optical systems, where the axis of cylindrical symmetry would be coincident with the axis of the primary electron beam. An example of a cylindrical optics system is described in U.S. Pat. No. 6,777,675 B2, issued Aug. 17, 2004, and in U.S. Patent Application Publication #2005/0001165 A1, published Jan. 6, 2005, both incorporated by reference herein. In a cylindrically-symmetrical embodiment, the SEFC electrode would comprise a single plate with a through hole, a small countersink on the surface facing the substrate, and a larger countersink on the surface away from the substrate. The design of the FFT electrode would comprise a single through hole, with a complex shape (determined by an iterative design optimization procedure) at the lower end. The SE and BSE detectors would comprise two small square or rectangular shapes. In a cylindrically-symmetric embodiment, the primary beam would pass down through the hole in the FFT, through the hole in the SEFC electrode, and then strike the substrate surface.

Although the present invention has been described above in terms of specific embodiments, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. An electron beam system comprising:
    an assembly for use in applying an electron beam onto a substrate and detecting backscattered electrons and secondary electrons, said assembly including:
    (a) a first field-free tunnel electrode having a first inside surface forming a first wall of a field-free tunnel for passage of an electron beam;
    (b) a second field-free tunnel electrode having a second inside surface, facing and spaced apart from said first inside surface to form said field-free tunnel;
    (c) a backscattered electron detector disposed on an opposite side of a lower end portion of said first field-free tunnel electrode from said first inside surface; and
    (d) a secondary electron detector disposed on an opposite side of a lower end portion of said second field-free tunnel electrode from said second inside surface;
    wherein said first inside surface of said first field-free tunnel electrode and said second inside surface of said second field-free tunnel electrode are substantially parallel.

2. A system as recited in claim 1 wherein said second tunnel electrode is disposed relative to said secondary electron detector to substantially shield said electron beam from an electric field caused by charge on said secondary electron detector.

3. A system as recited in claim 1 further comprising:
    (a) a first substrate electric field control electrode having a first inside edge portion, said first substrate electric field control electrode positioned between said substrate and both said first field-free tunnel electrode and said backscattered electron detector;
    (b) a second substrate electric field control electrode having a second inside edge portion, said second substrate electric field control electrode positioned between said substrate and both said second field-free tunnel electrode and said secondary electron detector; and
    wherein said first and second edge portions are separated by a gap for passing said electron beam.

4. A system as recited in claim 3 wherein said lower end portions of said first and second field-free tunnel electrodes extend toward said substrate, and wherein each said lower end portion is configured with surfaces angled away from said secondary electron detector and said second substrate electric field control electrode, whereby backscattered electrons emitted from the surfaces of said lower end portions are emitted in directions away from said secondary electron detector and said second substrate electric field control electrode.

5. A system as recited in claim 3 further comprising:
    a substrate electric-field control electrode voltage supply, electrically connected to said first and second control electrodes, for maintaining said control electrodes at a set voltage.

6. A system as recited in claim 3 wherein said first and second control electrodes are configured to control the electric field at an upper surface of said substrate.

7. A system as recited in claim 3 wherein said first and second edge portions are configured with surfaces angled toward the upper surface of said substrate, whereby backscattered and secondary electrons emitted from the surfaces of said edge portions are emitted toward an upper surface of said substrate.

8. A system as recited in claim 1, wherein said secondary electron detector is electrically connected to a first amplifier for generating a first signal proportional both to secondary electron emission from said substrate and to current in said electron probe; and wherein said backscattered electron detector is electrically connected to a second amplifier for generating a second signal proportional both to backscattered electron emission from said substrate and to said current in said electron probe.

9. A system as recited in claim 8, wherein said first signal and said second signal are electrically connected to a divisor circuit for forming a third signal proportional to the ratio of said first signal to said second signal, whereby said third signal is independent of said current in said electron probe.

10. A system as recited in claim 1, wherein said first inner surface and said second inner surface are both planar.

11. A system as recited in claim 1, wherein said first inner surface and said second inner surface are both curved.

12. A system as recited in claim 3, wherein said gap is substantially constant over the extent of said edge portions.

13. A system as recited in claim 3, wherein said first substrate electric field control electrode, said first field-free tunnel electrode and said backscattered electron detector are configured such that there is a line of sight between said backscattered electron detector and the surface area of said substrate where said electron beam impinges.

14. A system as recited in claim 3, wherein said second substrate electric field control electrode and said secondary electron detector are configured such that there is no line of sight between said secondary electron detector and the surface area of said substrate where said electron beam impinges.

15. A system as recited in claim 1, further comprising a backscattered electron detector support, said backscattered electron detector being attached to said support, said support being linear and substantially parallel to said first inside surface.

16. A system as recited in claim 15, further comprising a second backscattered electron detector attached to said support, said backscattered electron detectors being spaced along the linear length of said support.

17. A system as recited in claim 15, further comprising a multiplicity of backscattered electron detectors attached to said support, said backscattered electron detectors being spaced along the linear length of said support.

18. A system as recited in claim 1, further comprising a secondary electron detector support, said secondary electron detector being attached to said support, said support being linear and substantially parallel to said second inside surface.

19. A system as recited in claim 18, further comprising a second secondary electron detector attached to said support, said secondary electron detectors being spaced along the linear length of said support.

20. A system as recited in claim 18, further comprising a multiplicity of secondary electron detectors attached to said support, said secondary electron detectors being spaced along the linear length of said support.

21. An electron beam system comprising:
an assembly for use in applying a multiplicity of linearly spaced electron beams onto a substrate and detecting backscattered electrons and secondary electrons, said assembly including:
(a) a first field-free tunnel electrode having a first inside surface forming a first wall of a field-free tunnel for passage of a multiplicity of electron beams;
(b) a second field-free tunnel electrode having a second inside surface, facing and spaced apart from said first inside surface to form said field-free tunnel;
(c) a multiplicity of linearly spaced backscattered electron detectors disposed on an opposite side of a lower end portion of said first field-free tunnel electrode from said first inside surface; and
(d) a multiplicity of linearly spaced secondary electron detectors disposed on an opposite side of a lower end portion of said second field-free tunnel electrode from said second inside surface;
wherein the linear axis of said multiplicity of electron beams is parallel to the linear axes of both said backscattered electron detectors and said secondary electron detectors and wherein said first inside surface of said first field-free tunnel electrode and said second inside surface of said second field-free tunnel electrode are substantially parallel.

22. A system as recited in claim 21, wherein there is one of said multiplicity of backscattered electron detectors and one of said multiplicity of secondary electron detectors dedicated to each one of said multiplicity of electron beams.

* * * * *